(12) United States Patent
Qian et al.

(10) Patent No.: US 6,699,399 B1
(45) Date of Patent: *Mar. 2, 2004

(54) SELF-CLEANING ETCH PROCESS

(75) Inventors: Xue-Yu Qian, Milpitas, CA (US);
Zhi-Wen Sun, San Jose, CA (US);
Weinan Jiang, San Jose, CA (US);
Arthur Y. Chen, Fremont, CA (US);
Gerald Zheyao Yin, Cupertino, CA (US); Ming-Hsun Yang, Taipei (TW);
Ming-Hsun Kuo, Keelung (TW);
David S. L. Mui, San Jose, CA (US);
Jeffrey Chinn, Foster City, CA (US);
Shaoher X. Pan, San Jose, CA (US);
Xikun Wang, Sunnyvale, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/657,793

(22) Filed: Sep. 8, 2000

Related U.S. Application Data

(63) Continuation of application No. 08/969,122, filed on Nov. 12, 1997, now Pat. No. 6,136,211.
(51) Int. Cl.[7] .................................................. C23F 4/00
(52) U.S. Cl. ............................. 216/67; 216/74; 216/79; 134/1.1; 134/22.1; 134/37
(58) Field of Search ........................... 134/1.1, 22.1, 134/37; 438/905, 719, 721, 723, 724; 216/67, 74, 79

(56) References Cited

U.S. PATENT DOCUMENTS 4,282,267 A   8/1981  Küyel ......................... 427/38
4,433,228 A   2/1984  Nishimatsu et al. .. 219/10.55 R
4,465,532 A   8/1984  Fukano ....................... 156/643

(List continued on next page.)

FOREIGN PATENT DOCUMENTS

DE    4132559    4/1993
EP    0200951    12/1986
EP    0272143    6/1988

(List continued on next page.)

OTHER PUBLICATIONS

Aydil, et al., "Multiple Steady States in a Radio Frequency Chlorine Glow Discharge," *J. Appl. Phys.*, vol. 69, No. 1, Jan. 1, 1991, pp. 109–114.
Hillenius, S.J., et al., "A Symmetric Submicron CMOS Technology," *IEEE*, pp. 252–255, 1986.
PCT Search Report dated Oct. 28, 1999.
PCT Notification of International Search Report dated Feb. 4, 1999.

(List continued on next page.)

*Primary Examiner*—Allan Olsen
(74) *Attorney, Agent, or Firm*—Ashok K. Janah; Joseph Bach

(57) ABSTRACT

A process for etching a substrate 25 in an etching chamber 30, and simultaneously cleaning a thin, non-homogeneous, etch residue deposited on the surfaces of the walls 45 and components of the etching chamber 30. In the etching step, process gas comprising etchant gas is used to etch a substrate 25 in the etching chamber 30 thereby depositing etch residue inside the chamber 30. Cleaning gas is added to the process gas for a sufficient time and in a volumetric flow ratio that is sufficiently high, to react with and remove substantially all the etch residue deposited by the process gas. The present method advantageously cleans the etch residue in the chamber 30, during the etching process, and without use of separate cleaning, conditioning, and seasoning process steps.

72 Claims, 10 Drawing Sheets

U.S. PATENT DOCUMENTS

| | | | | |
|---|---|---|---|---|
| 4,490,209 | A | 12/1984 | Hartman | 156/643 |
| 4,502,914 | A | 3/1985 | Trumpp et al. | 156/643 |
| 4,576,692 | A | 3/1986 | Fukuta et al. | 204/165 |
| 4,705,595 | A | 11/1987 | Okudaira et al. | 156/643 |
| 4,738,748 | A | 4/1988 | Kisa | 156/643 |
| 4,786,352 | A | 11/1988 | Benzing | 156/345 |
| 4,799,991 | A | 1/1989 | Dockrey | |
| 4,818,326 | A | 4/1989 | Liu et al. | 156/345 |
| 4,831,963 | A | 5/1989 | Saito et al. | 118/723 |
| 4,863,561 | A | 9/1989 | Freeman et al. | 156/646 |
| 4,867,841 | A | 9/1989 | Loewenstein et al. | 156/643 |
| 4,876,212 | A | 10/1989 | Koury | 437/34 |
| 4,975,144 | A | 12/1990 | Yamazaki et al. | 156/643 |
| 4,992,134 | A | 2/1991 | Gupta et al. | 156/628 |
| 4,992,136 | A | 2/1991 | Tachi et al. | 156/643 |
| 4,994,410 | A | 2/1991 | Sun et al. | 437/192 |
| 5,002,632 | A | 3/1991 | Loewenstein et al. | 156/643 |
| 5,013,398 | A | 5/1991 | Long et al. | 156/643 |
| 5,035,768 | A | 7/1991 | Mu et al. | 156/626 |
| 5,084,126 | A | 1/1992 | McKee | 156/345 |
| 5,094,712 | A | 3/1992 | Becker et al. | 156/643 |
| 5,110,408 | A | 5/1992 | Fujii et al. | 156/643 |
| 5,110,411 | A | 5/1992 | Long | 156/656 |
| 5,118,387 | A | 6/1992 | Kadomura | 156/657 |
| 5,158,644 | A | 10/1992 | Cheung et al. | 156/643 |
| 5,160,407 | A | 11/1992 | Latchford et al. | 156/656 |
| 5,164,330 | A | 11/1992 | Davis et al. | 437/192 |
| 5,176,792 | A | 1/1993 | Fullowan et al. | 156/652 |
| 5,180,464 | A | 1/1993 | Tatsumi et al. | 156/626 |
| 5,188,980 | A | 2/1993 | Lai | 437/193 |
| 5,192,702 | A | 3/1993 | Tseng | 437/47 |
| 5,219,485 | A | 6/1993 | Wang et al. | |
| 5,256,245 | A | 10/1993 | Keller et al. | 156/643 |
| 5,259,923 | A | 11/1993 | Hori et al. | |
| 5,281,302 | A | 1/1994 | Gabric et al. | 156/643 |
| 5,282,899 | A | 2/1994 | Balmashnov et al. | 118/723 R |
| 5,312,519 | A | 5/1994 | Sakai et al. | 134/1 |
| 5,318,668 | A | 6/1994 | Tamaki et al. | 156/662 |
| 5,338,398 | A | 8/1994 | Szwejkowski et al. | 156/655 |
| 5,354,416 | A | 10/1994 | Okudaira et al. | |
| 5,354,417 | A | 10/1994 | Cheung et al. | 156/643 |
| 5,356,478 | A | 10/1994 | Chen et al. | 134/1 |
| 5,358,601 | A | 10/1994 | Cathey | 156/656 |
| 5,378,311 | A | 1/1995 | Nagayama et al. | 156/643 |
| 5,382,316 | A | 1/1995 | Hills et al. | 156/643 |
| 5,384,009 | A | * 1/1995 | Mak et al. | 216/37 |
| 5,413,954 | A | 5/1995 | Aydil et al. | 437/81 |
| 5,431,772 | A | 7/1995 | Babie et al. | 156/643.1 |
| 5,443,686 | A | 8/1995 | Jones et al. | 216/37 |
| 5,449,411 | A | 9/1995 | Fukuda et al. | 118/723 MP |
| 5,514,622 | A | 5/1996 | Bornstein et al. | 437/189 |
| 5,521,119 | A | 5/1996 | Chen et al. | 437/187 |
| 5,529,197 | A | 6/1996 | Grewal | 216/68 |
| 5,605,601 | A | 2/1997 | Kawasaki | 156/643.1 |
| 5,620,615 | A | 4/1997 | Keller | 438/720 |
| 5,626,775 | A | 5/1997 | Roberts et al. | 216/67 |
| 5,644,153 | A | 7/1997 | Keller | 257/324 |
| 5,700,741 | A | 12/1997 | Liao | |
| 5,716,495 | A | 2/1998 | Butterbaugh et al. | 156/643.1 |
| 5,753,533 | A | 5/1998 | Saito | 437/192 |
| 5,756,400 | A | 5/1998 | Ye et al. | 438/710 |
| 5,767,021 | A | 6/1998 | Imai et al. | 438/719 |
| 5,788,799 | A | 8/1998 | Steger et al. | 156/345 |
| 5,843,239 | A | 12/1998 | Shrotriya | 134/1.1 |
| 5,861,233 | A | 1/1999 | Sekine et al. | 430/296 |
| 5,866,483 | A | 2/1999 | Shiau et al. | 438/720 |
| 5,869,401 | A | 2/1999 | Brunemeier et al. | 438/710 |
| 5,874,363 | A | 2/1999 | Hoh et al. | 438/721 |
| 5,879,575 | A | 3/1999 | Tepman et al. | 216/68 |
| 6,090,718 | A | 7/2000 | Soga et al. | |
| 6,125,859 | A | 10/2000 | Kao et al. | 134/1.1 |
| 6,270,634 | B1 | 8/2001 | Kumar et al. | 204/192.37 |

FOREIGN PATENT DOCUMENTS

| | | |
|---|---|---|
| EP | 0314990 | 5/1989 |
| EP | 0463373 | 1/1992 |
| EP | 0516043 | 12/1992 |
| EP | 0555546 | 8/1993 |
| EP | 0697467 | 2/1996 |
| EP | 0709877 | 5/1996 |
| EP | 0746015 | 12/1996 |
| JP | 01050427 | 2/1988 |
| JP | 6177092 | 6/1994 |
| JP | 7029879 | 1/1995 |
| JP | 1023387 | 9/1998 |
| WO | 9615545 | 5/1996 |

OTHER PUBLICATIONS

U.S. patent application entitled, "Method for Improved Cleaning of Substrate Processing System"; filed Jul. 11, 1997; Ser. No. 08/893,922; Inventors: Kao, et al.

U.S. patent application entitled, "Apparatus for Improved Remote Microwave Plasma source for Use with Substrate Processing Systems"; filed Apr. 23, 1997; Ser. No. 08/839,111; Inventors: Kao, et al.

U.S. patent application entitled, "Method and Apparatus for Determining the Endpoint in a Plasma Cleaning Process"; filed Jul. 2, 1997; Ser. No. 08/887,165; Inventors: Subrahmanyam, et al.

U.S. patent application entitled, "Apparatus and Method for Efficient and Compact Remote Microwave Plasma Generation"; filed Apr. 22, 1997; Ser. No. 08/839,007; Inventor: Bhatnagar.

U.S. patent application entitled, "Method and Apparatus for Pre–stabilized Plasma Generation for Microwave Clean Applications"; filed Nov. 13, 1996; Ser. No. 08/746,658; Inventors: Fong, et al.

U.S. patent application entitled, "Inductively Coupled HDP–CVD Reactor"; Filed May 29, 1997; Ser. No. 08/865,018; Inventors: Redeker, et al.

U.S. patent application entitled, "Symmetric Tunable Inductively Coupled HDP–CVD Reactor"; filed Jul. 15, 1996; Ser. No. 08/679,927; Inventors: Redeker, et al.

U.S. patent application entitled, "Apparatus and Methods for Upgrade Substrate Processing System with Microwave Plasma Source"; filed Mar. 5, 1997; Ser. No. 08/811,627; Inventors: Tanaka, et al.

U.S. patent application entitled, "Microwave Apparatus for In–situ Vacuum Line Cleaning for Substrate Processing Equipment"; filed Oct. 30, 1996; Ser. No. 08/741,241; Inventors: Pang, et al.

PCT Search Report dated Nov. 8, 2000.

PCT Written Opinion dated Dec. 18, 2000.

Kimizuka, Masakatsu et al. "Pattern Profile Control in Magnetron reactive ion etching of Poly–Si." J. Vac. Sci. Technol. B 10(5), Sep./Oct. 1992. pp. 2192–2196.

* cited by examiner

SELF-CLEANING ETCH PROCESS

CROSS-REFERENCE

This application is a continuation application of U.S. patent application Ser. No. 08/969,122, filed on Nov. 12, 1997, now U.S. Pat. No. 6,136,211, which is incorporated herein by reference in its entirety.

BACKGROUND

The present invention relates to a method for etching semiconductor substrates in etching chambers, and of cleaning the etching chambers.

In the manufacture of integrated circuits, silicon dioxide, silicon nitride, polysilicon, metal silicide, and monocrystalline silicon on a substrate, are etched in predefined patterns to form gates, vias, contact holes, trenches, and/or interconnect lines. In the etching process, a patterned mask layer composed of oxide or nitride hard mask or photoresist, is formed on the substrate using conventional methods. The exposed portions of the substrate between the patterned mask are etched by capacitive or inductively coupled plasmas of etchant gases. During the etching processes, a thin polymeric etch residue deposits on the walls and other component surfaces inside the etching chamber. The composition of the etch residue depends upon the composition of vaporized species of etchant process gas, the substrate material being etched, and the mask or resist layer applied on the substrate. For example, when tungsten silicide, polysilicon or other silicon-containing layers are etched, silicon-containing gaseous species are vaporized or sputtered from the substrate, and etching of metal layers results in vaporization of metal species. In addition, the resist or mask layer on the substrate is also partially vaporized by the etchant gas to form gaseous hydrocarbon or oxygen species. The vaporized or gaseous species in the chamber condense to form polymeric byproducts composed of hydrocarbon species from the resist; gaseous elements such as fluorine, chlorine, oxygen, or nitrogen; and elemental silicon or metal species depending on the composition of the substrate being,etched. The polymeric byproducts deposit as thin layers of etch residue on the walls and components in the chamber. The composition of the etch residue layer typically varies considerably across the chamber surface depending upon the composition of the localized gaseous environment, the location of gas inlet and exhaust ports, and the chamber geometry.

The compositional variant, non-homogeneous, etch residue layer formed on the etching chamber surfaces has to be periodically cleaned to prevent contamination of the substrate. Typically, after processing of about 25 wafers, an in-situ plasma "dry-clean" process is performed in an empty etching chamber to clean the chamber. However, the energetic plasma species rapidly erode the chamber walls and chamber components, and it is expensive to often replace such parts and components. Also, erosion of the chamber surfaces can result in instability of the etching process from one wafer to another. The thin compositional variant etch residue can also make it difficult to stop the in-situ plasma clean process upon removal of all the residue, resulting in erosion of the underlying chamber surfaces, and making it difficult to clean the hard residue off all the chamber surfaces. For example, the etch residue formed near the chamber inlet or exhaust often has a high concentration of etchant gas species than that formed near the substrate which typically contains a higher concentration of resist, hard mask, or of the material being etched.

It is difficult to form a cleaning plasma that uniformly etches away the compositional variants of etch residue. Thus after cleaning of about 100 or 300 wafers, the etching chamber is opened to the atmosphere and cleaned in a "wet-cleaning" process, in which an operator uses an acid or solvent to scrub off and dissolve accumulated etch residue on the chamber walls. To provide consistent chamber surface properties, after the wet cleaning step, the chamber surfaces are "seasoned" by pumping down the chamber for an extended period of time, and thereafter, performing a series of runs of the etch process on dummy wafers. The internal chamber surfaces should have consistent chemical surfaces, i.e., surfaces having little or no variations in the concentration, type, or functionality of surface chemical groups; otherwise, the etching processes performed in the chamber produce widely varying etching properties from one substrate to another. In the pump-down process, the chamber is maintained in a high vacuum environment for 2 to 3 hours to outgas moisture and other volatile species trapped in the chamber during the wet clean process. Thereafter, the etch process to be performed in the chamber, is run for 10 to 15 minutes on dummy wafers, or until the chamber provides consistent and reproducible etching properties.

In the competitive semiconductor industry, the increased cost per substrate that results from the downtime of the etching chamber, during the dry or wet cleaning, and seasoning process steps, is highly undesirable. It typically takes 5 to 10 minutes for each dry cleaning process step, and 2 to 3 hours to complete the wet cleaning processes. Also, the wet cleaning and seasoning process often provide inconsistent and variable etch properties. In particular, because the wet cleaning process is manually performed by an operator, it often varies from one session to another, resulting in variations in chamber surface properties and low reproducibility of etching processes. Thus it is desirable to have an etching process that can remove or eliminate deposition of etch, residue on the chamber surfaces.

In semiconductor fabrication; yet another type of problem arises in the etching of multiple layers of materials that have similar constituent elements, for example, silicon-containing materials such as tungsten silicide, polysilicon, silicon nitride, and silicon dioxide. With reference to FIGS. 1a and 1b, a typical multilayer polycide structure on a semiconductor substrate comprises metal silicide layers 22 deposited over doped or undoped polysilicon layers 24. The polycide layers are formed over silicon dioxide layers 26, and etched to form the etched features 30. In these multilayer structures, it is difficult to obtain a high etching selectivity ratio for etching the metal silicide layer relative to the overlying resist layer 28, or the underlying polysilicon layer 24. It is especially desirable have high etching selectivity ratios for polycide structures that have a non-planar and highly convoluted topography, where the portion of the conformal metal silicide layer 22 between the etched features is thicker than the portion of the metal silicide layer 22 on top of the etched features (not shown). At a certain time during the etching process, the thinner metal silicide layer is etched through and etching of the underlying polysilicon layer begins, while the thicker metal silicide layer 22 is still being etched. This requires that the polysilicon layer 24 be etched sufficiently slowly relative to the rate of etching of the metal silicide layer, that the entire polysilicon layer 24 below the thinner metal silicide layer is not etched through, before completion of etching of the thicker portions of the metal silicide layer 22. Thus, it is desirable to etch the metal silicide layer 22 at a faster rate relative to the rate of etching of the polysilicon layer 24. The same problem arises in the etching of a mask layer of silicon nitride 32, on a very thin silicon dioxide layer 34, prior to forming trenches in a substrate comprising silicon 36, as for example shown in FIGS. 1c and 1d. The etched trenches 38 are used to isolate active MOSFET devices formed on the substrate. The etching selectivity ratio for etching silicon nitride relative to silicon dioxide has to be very high to stop on the silicon dioxide layer without etching through the layer.

High etching selectivity ratios are obtained by using process gas compositions that etch the different silicon-containing materials at significantly different etching rates, which depend upon the chemical reactivity of the particular process gas composition with a particular layer. However, etching metal silicide layers with high selectivity to polysilicon, or etching silicon nitride layers with high selectivity to silicon dioxide layers, is particularly difficult because both materials contain elemental silicon and most conventional etchant plasmas etch the silicon containing layers to form gaseous $SiCl_x$ or $SiF_x$ species. Thus, it is difficult for the etchant plasma to chemically distinguish and preferentially etch the metal silicide layer 22 faster than the polysilicon layer 24, and the silicon nitride layer 32 faster than the silicon dioxide layer 34. This problem is further exacerbated because the etchant residue formed on the chamber sidewalls also contains silicon dioxide, and attempts to remove the etchant residue during the polycide etching process, result in substantially lowering the rate of etching selectivity ratio of these layers.

Thus it is desirable to have an etch process that reduces formation of etch residue deposits in the etching chamber. It is also desirable that the etch or cleaning gases do not to erode the exposed surfaces in the chamber. It is further desirable to have an etch or cleaning process that restores the original chemical reactivity and surface functional groups of the chamber surfaces. It is further desirable for the chamber cleaning process to remove chemically adhered etch residue layers having variable thickness and stoichiometry, without excessive erosion of underlying chamber surfaces. It is also desirable to have an etch process for removing etch residues generated by etching multiple layers of materials, for example, silicon dioxide containing etch residues during etching of tungsten silicide on polysilicon layers, or silicon nitride on silicon dioxide layers, without sacrificing their etching selectivity ratio.

SUMMARY

In one aspect of the invention, a substrate processing method comprises placing a substrate in a chamber, the substrate having a layer thereon, providing an energized etchant gas in the chamber to etch substantially through the layer while providing an energized cleaning gas to substantially clean the chamber, and repeating the steps.

In another aspect of invention, a substrate processing method comprises placing a substrate in a chamber, the substrate having a layer thereon; providing an energized etchant gas in the chamber to etch the layer, the energized etchant gas being provided before etchant residue from the layer has been formed on the chamber surfaces, during the previous step, providing an energized cleaning gas to substantially clean the chamber; and repeating the steps.

In another aspect of the invention, a substrate processing method comprises placing a substrate in a chamber, providing a first energized etchant gas in the chamber to etch the substrate, providing a second energized etchant gas in the chamber to etch the substrate, and providing a burst of energized cleaning gas during the providing of the first energized etchant gas and/or the second energized etching gas to substantially clean the chamber.

In another aspect of the invention, a substrate processing method comprises placing a substrate in a chamber, providing an energized etchant gas in the chamber to etch the substrate while simultaneously providing a burst of energized cleaning gas to substantially clean the chamber surfaces, and repeating the steps.

In another aspect of the invention, a substrate processing method comprises placing a substrate in a chamber, providing a first energized etchant gas in the chamber to etch the substrate, the first energized etchant gas comprising a chlorine-containing gas or a bromine-containing gas, providing a second energized etchant gas in the chamber to etch the substrate, and during the providing of the first energized etchant gas and/or the second energized etching gas, providing an energized cleaning gas to clean the chamber surfaces.

In another aspect of the invention a substrate processing method comprises placing a substrate in a chamber, providing an energized etchant gas in the chamber to etch the substrate, providing a burst of energized cleaning gas in the chamber to clean the chamber surfaces, the energized cleaning gas comprising one or more of (i) carbon and fluorine species, and (ii) sulfur and fluorine species, and after the burst of energized cleaning gas, removing the substrate from the chamber.

In another aspect of the invention, a substrate processing method comprises placing the substrate in a process zone of a chamber and providing in the process zone an energized process gas comprising an etchant gas and a cleaning gas in a volumetric flow ratio of cleaning gas to etchant gases sufficiently high to at least partially remove etchant residue deposited on surfaces in the chamber, the etchant gas comprising a first halogen containing gas and one or more of a second halogen containing gas, $N_2$, $O_2$, and $He$—$O_2$.

In another aspect of the invention, a substrate processing method comprises placing the substrate in a process zone of a chamber; providing in the process zone an energized process gas comprising etchant gas to etch the substrate, the etchant gas comprising a first halogen and one or more of $N_2$, a second halogen, $O_2$, and $He$—$O_2$; and providing in the process zone a burst of energized cleaning gas while the substrate is being etched, the volumetric flow ratio of cleaning gas to etchant gases being sufficiently high to at least partially remove etchant residue deposited on surfaces in the chamber.

In another aspect of the invention, a substrate processing method comprises placing the substrate in the etching chamber, providing an energized process gas in the etching chamber in a volumetric flow rate selected to etch the substrate and at least partially remove etchant residue formed on the chamber surfaces, the process gas comprising carbon and fluorine species, and repeating the steps.

In another aspect of the invention, a substrate processing method comprises placing the substrate in the etching chamber, providing an energized process gas in the etching chamber in a volumetric flow rate selected to etch the substrate and at least partially remove etchant residue formed on the chamber surfaces, the process gas comprising sulfur and fluorine species, and repeating the steps.

In another aspect of the invention, a substrate processing method comprises placing a substrate in a chamber, providing an energized etchant gas in the chamber to etch the substrate, and providing a burst of energized cleaning gas in the chamber while the substrate is being etched to at least partially clean the chamber surfaces, the energized cleaning gas comprising carbon and fluorine species.

In another aspect of the invention, a substrate processing method comprises placing a substrate in a chamber, providing an energized etchant gas in the chamber to etch the substrate, and providing a burst of energized cleaning gas in the chamber while the substrate is being etched to at least partially clean the chamber surfaces, the energized cleaning gas comprising sulfur and fluorine species.

The present invention provides a method of etching a substrate in an etching chamber, that reduces or entirely eliminates the etch residues on the chamber surfaces and provides highly consistent and reproducible etching performance. In the method a substrate is etched and simultaneously, the etching chamber is cleaned off etch residue. A substrate is placed in the chamber, and a plasma is formed from process gas introduced into the chamber to simultaneously etch the substrate, and clean etch residue deposited on the chamber surfaces. The process gas comprises (i) etchant gas for etching the substrate thereby forming etch residue on chamber surfaces, and (ii) cleaning gas for cleaning the etch residue formed on the chamber surfaces, the volumetric flow ratio of cleaning gas to etchant gas selected so that the etch residue is substantially entirely removed from the chamber surfaces upon completion of the etch process.

The method is useful for etching metal silicide, silicon nitride, polysilicon, or monocrystalline silicon on a substrate, while simultaneously cleaning the etching chamber of silicon dioxide containing etch residue. In this method, a plasma is generated from one or more process gases introduced into the chamber to etch the substrate and clean the etch residue on the etching chamber surfaces. The process gas comprises (i) etchant gases for etching metal silicide, polysilicon, or silicon on the substrate thereby forming silicon dioxide etch residue on the etching chamber surfaces, and (ii) cleaning gas for removing the silicon dioxide etch residue on the etching chamber surfaces. The volumetric flow ratio of cleaning gas to etchant gas selected to remove substantially all the silicon dioxide etch residue from the chamber surfaces upon completion of the etch process.

In one example of the present process, a substrate comprising silicon-containing material (metal silicide, monocrystalline silicon, polycrystalline silicon, silicon nitride or silicon oxide) is etched using a plasma of process gas comprising $Cl_2$, $N_2$, and $CF_4$, in a volumetric flow ratio selected to remove substantially all the etch residue formed on the chamber surfaces upon completion of the etching process. Preferably, the volumetric flow ratio of $Cl_2$, $N_2$, and $CF_4$, is selected to remove substantially all the etchant residue generated by etching at least 2000 substrates in the chamber, without performing a separate cleaning step for cleaning the chamber. The ratio of the volumetric flow ratio of $CF_4$: ($Cl_2+N_2$) is more preferably from about 1:20 to about 1:1. In another example, the process uses a process gas comprising $Cl_2$, $N_2$, and $SF_6$, preferably, the volumetric flow ratio of $SF_6$: ($Cl_2+N_2$) being from about 1:20 to about 1:1. In yet another example, a suitable process gas comprises $Cl_2$, $N_2$, and $NF_3$, preferably, the volumetric flow ratio of $NF_3$: ($Cl_2+N_2$) being from about 1:20 to about 1:1.

The method is particularly useful for etching substrates comprising multiple layers, for example, for etching polycide structures composed of tungsten silicide and polysilicon layers, or for etching silicon nitride layers deposited over silicon dioxide layers—while simultaneously cleaning the etching chamber of silicon dioxide containing etch residue. The multiple layers are etched in a multiple stage process. In a first etching stage, a first etchant gas is introduced into the chamber and a plasma generated from the first etchant gas for etching the first layer. In a second etching stage, a second etchant gas is introduced into the chamber and a plasma is generated from the second etchant gas for etching the second layer. In one or more these stages, cleaning gas is added to the etchant gas to generate a cleaning plasma that removes all the silicon dioxide etch residue formed on the etching chamber surfaces in both of the etching stages.

In another aspect, the method of the present invention is useful for fabricating a semiconductor substrate. In this method, a process gas comprising etchant gases for etching the substrate, is introduced into the chamber, and a plasma is generated from the etchant gas to etch the substrate. A burst of cleaning gas is added to the process gas while the substrate is still being etched, to clean the chamber surfaces. The cleaning gas is added for a sufficient time, and the volumetric flow ratio of cleaning gas to etchant gases is sufficiently high, to remove substantially all the etch residue formed or deposited during the etching process.

DRAWINGS

These and other features, aspects, and advantages of the present invention will be better understood from the following drawings, description and appended claims, which illustrate examples of the invention. While the description and drawings below illustrate exemplary features of the invention, it is to be understood that each of the features can be used in the invention in general, not merely in the context of the particular drawings, and the invention includes any combination of these features.

DESCRIPTION

Figure 2:
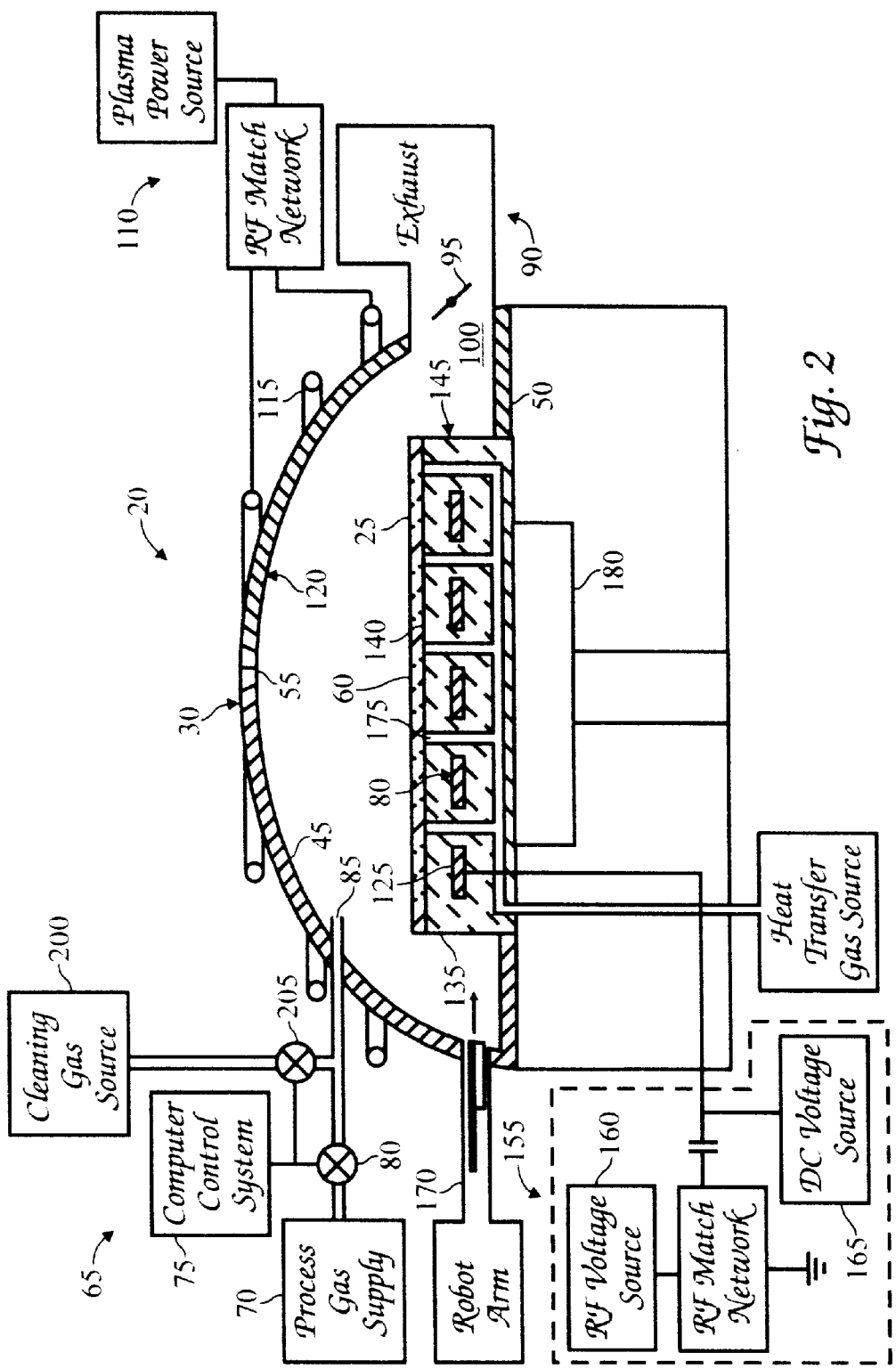
FIG. 2 is a sectional schematic side view of an etching apparatus of the present invention.

An apparatus 20 suitable for etching a substrate 25 according to the present invention, as schematically illustrated in FIG. 2, comprises an enclosed process chamber 30 defining a process zone for processing the substrate. A load-lock transfer area (not shown) is maintained at low pressure for holding a cassette of substrates 25. The particular embodiment of the apparatus 20 shown herein is suitable for processing of semiconductor substrates 25, is provided only to illustrate the invention, and should not be used to limit the scope of the invention. The enclosed chamber 30 has sidewalls 45 and a bottom wall 50 fabricated from any one of a variety of materials including metals, ceramics, glasses, polymers, and composite materials. The process zone defined in the etching chamber 30 is directly above and surrounds the substrate 25 and comprises a volume of at least about 10,000 cm$^3$, and more preferably about 10,000 to about 50,000 cm$^3$. The chamber comprises a ceiling 55 that is flat or rectangular shaped, arcuate, conical, dome-shaped, or multiradius dome shaped. Preferably, the ceiling 55 is dome-shaped to provide a uniform distribution of plasma source power across the entire volume of the plasma process zone. The dome-shaped ceiling 55 is further from the substrate center 60 than a flat ceiling, and can reduce dissociated ion recombination losses near the substrate 25 to provide more uniform plasma ion density across the substrate surface than a flat ceiling. The dome ceiling 55 can be a flattened dome, conical, truncated conical, cylindrical, or other combination of such shapes, that provides a dome shaped surface above the substrate 25.

Process gas is introduced into the chamber 30 through a gas distribution system 65 that includes a process gas supply 70 and a gas flow control system that comprises a conventional computer system 75 operating a gas flow control valve 80. The gas distribution system 65 can comprise gas outlets 85 located peripherally around the substrate 25 (as shown), or a showerhead mounted on the ceiling of the chamber 30 with outlets therein (not shown). A second gas supply system 200 provides cleaning gas to the chamber 30 via an electronically operated valve 205. Spent process gas and etchant byproducts are exhausted from the process chamber 30 through an exhaust system 90 (typically including a 1000 liter/sec roughing pump) capable of achieving a minimum pressure of about $10^{-3}$ mTorr in the chamber 30. A throttle valve 95 is provided in the exhaust 90 to control the flow of spent process gas and the pressure of process gas in the chamber 30. Preferably, an asymmetric pumping channel 100 is used to pump gases out of the chamber 30 to provide a more symmetrical and uniform distribution of gaseous species around the surface 105 of the substrate.

A plasma is generated from the process gas introduced into the chamber 30, using a plasma generator 110 that couples an electric field into the process zone of the chamber. A suitable plasma generator 110 comprises an inductor antenna 115 consisting of one or more inductor coils having a circular symmetry with a central axis coincident with the longitudinal vertical axis that extends through the center of the process chamber 30 and perpendicular to the plane of the substrate 25. Preferably, the inductor antenna 115 comprises solenoid coils having from 1 to 10 turns, and more typically from 2 to 6 turns. The arrangement and number of solenoid coils are selected to provide the desired product of current and antenna turns (d/dt)(N.I) near the ceiling 55 to provide a strong inductive flux linkage with close coupling to the plasma and therefore greater plasma ion density in the plasma zone adjacent to the substrate 25, as described in U.S. patent application Ser. No. 08/648,254, which is incorporated herein by reference. When the inductor antenna 115 is positioned near the dome ceiling 55, the ceiling of the chamber 30 comprises dielectric material which is transparent to RF fields, such as a slab of machined silicon dioxide or tiles of silicon or silicon dioxide bonded to one another to provide a curved shape. Preferably, the inductor coil 115 wrapped around the sidewall 45 of the process chamber 30 is a multiradius dome-shaped inductor coil having a "flattened" dome shape that provides increased plasma ion density directly over the substrate center 60 because ion density is affected by local ionization near the inductor coil 115, and a multiradius inductor coil is closer to the substrate center 60 than a hemispherical coil. In another preferred embodiment, the ceiling 55 comprises a multiradius dome having at least a center radius R and a corner radius r, wherein r is less than the center radius R and R/r is from about 2 to about 10.

The plasma formed in the plasma zone can also be enhanced using magnetically enhanced reactors, in which a magnetic field generator (not shown), such as a permanent magnet or electromagnetic coils, are used to apply a magnetic field in the plasma zone to increase the density and uniformity of the plasma. Preferably, the magnetic field comprises a rotating magnetic field with the axis of the field rotating parallel to the plane of the substrate, as described in U.S. Pat. No. 4,842,683, issued Jun. 27, 1989, which is incorporated herein by reference. The magnetic field in the chamber should be sufficiently strong to increase the density of the ions formed in the plasma, and sufficiently uniform to reduce charge-up damage to features such as CMOS gates. Generally, the magnetic field as measured on the surface of the substrate is less than about 500 Gauss, more typically from about 10 to about 100 Gauss, and most typically from about 10 Gauss to about 30 Gauss.

In addition to the inductor antenna 115, one or more process electrodes can be used to accelerate or energize the plasma ions in the chamber 30. The process electrodes include a first electrode 120 forming a wall of the process chamber 30, such as the ceiling 55 and/or sidewalls 45 of the chamber. The first electrode 120 is capacitively coupled to a second electrode 125 below the substrate 25. An electrode voltage supply 155 supplies an RF potential that maintains the first and second electrodes 120, 125 at different electrical potentials relative to one another. The frequency of the RF voltage applied to the inductor antenna 115 is typically about 50 KHz to about 60 MHZ, and more typically about 13.56 MHZ; and the power level of RF voltage applied to the antenna is about 100 to about 5000 Watts.

The enclosed chamber 30 comprises one or more ceramic surfaces that serve different functions. For example, in one preferred embodiment, the walls 45, 50, 55 of the process chamber are coated with a ceramic material, such as boron carbide, boron nitride, silicon, silicon oxide, silicon carbide, or silicon nitride, to protect the walls from chemically erosion in particular etchant gas compositions. For example, boron carbide is useful for protecting sidewalls 45 of chambers from erosion in fluorinated gaseous environments. As another example, sapphire (aluminum oxide) gas distribution plates can be used to release process gas into the chamber 30. When the chamber contains ceramic surfaces, the etch residues are difficult to remove, because they can react with some of the ceramic surfaces in the chamber 30 (for example, the surface of the monolithic ceramic member 135 which has highly reactive surface functional groups) such as aluminum oxide, aluminum nitride, silicon, and silicon oxide ceramic surfaces. For example, aluminum oxide or nitride surfaces when exposed to oxygen or moisture form Al—OH surface functional groups that chemically react with the etch residue to form a hard adherent coating on the chamber surfaces or components.

Another ceramic surface useful in the process chamber 30 is that of a monolithic ceramic member 135 having a ceramic receiving surface 140 for receiving a substrate 25 thereon. Suitable ceramic materials include one or more of aluminum oxide, aluminum nitride, boron carbide, boron nitride, silicon, silicon oxide, silicon carbide, silicon nitride, and titanium oxide. The second electrode 125 is embedded in the ceramic member 135 so that ceramic material completely surrounds the second electrode to form a unitary monolithic ceramic member. The second electrode 125 is fabricated from an electrical conductor metal such as tungsten, tantalum or molybdenum. The embedded second electrode 125 is the conductor to which a "hot" RF potential is applied, with the other electrodes in the chamber 30 maintained at different potentials, including electrical ground or floating potentials, relative to the second electrode 125. Because it is embedded in the unitary ceramic member 135, the second electrode 125 does not have to be electrically isolated from the chamber 30 by additional insulator shields, thereby reducing the parasitic capacitance impedance loads in the chamber 30 that would otherwise result between the second electrode 125 and the grounded chamber walls 45, 50. The second electrode 125 also serves as an electrostatic chuck 145 that generates an electrostatic charge for electrostatically holding the substrate 25 to the receiving surface 140 of the ceramic member 135 using a DC chucking voltage applied through an electrical conductor 150 inserted through the ceramic member 135 to connect to the second electrode 125.

The first and second electrodes 120, 125 are electrically biased relative to one another by the electrode voltage supply 155 that includes an AC voltage 160 supply for providing a plasma generating RF voltage to the second electrode 125, and a DC voltage supply 165 for providing a chucking voltage to the electrode 125. The AC voltage supply 160 provides an RF generating voltage having one or more frequencies from 13.56 MHZ to 400 KHz to form a capacitively coupled plasma in the chamber 30. The power level of the RF bias current applied to the electrode 125 is typically from about 50 to about 3000 Watts. A separate DC voltage is applied to the electrode 125 to form an electrostatic charge that holds the substrate 25 to the chuck 145. The RF power is coupled to a bridge circuit and an electrical filter to provide DC chucking power to the electrode 125.

Etching & Cleaning Process

Operation of the etching chamber 30 to etch one or more of the layers on the substrate 25, and simultaneously clean the etching chamber, will now be described. The substrate 25 typically comprises a semiconductor material, such as a silicon or gallium arsenide wafer, with a plurality of layers comprising, for example, an underlayer of silicon dioxide that functions as a gate oxide layer for MOS transistors, and an overlayer of polycide, which is a combination of tungsten silicide and underlying polysilicon layers. The metal silicide layer on the substrate 25 comprises, for example, tungsten, tantalum, titanium, or molybdenum suicides. A polysilicon layer is below the metal silicide layer and over a silicon dioxide layer. A patterned mask layer, such as photoresist, or a silicon dioxide or silicon nitride hard mask, is formed on the substrate 25. The exposed portions of the substrate between the mask layer are etched to form features, such as for example, contact holes for fabricating gate electrodes for MOS transistors; polycide interconnecting features that are typically used as gate electrodes; and vias which are multilayer metal structures used to electrically connect two or more electrically conductive layers separated by insulating silicon oxide/nitride layers. In another example, the substrate comprises silicon nitride layers or silicon oxide layers on a silicon (doped or undoped) substrate.

To perform the process of the present invention, a substrate 25 is transferred using a robot arm 170 from a load-lock transfer chamber through a slit valve and into the chamber 30. A lift finger assembly (not shown) has lift fingers that extend through lift finger openings in the chuck 145 to receive or lift the substrate 25 off the chuck 145. The robot arm 170 places the substrate 25 on the tips of the lift fingers (not shown) that are elevated by the pneumatic lift mechanism 180 to extend about 2 to 5 centimeters above the surface of the chuck 145. The pneumatic mechanism, under the control of a computer system, lowers the substrate 25 onto the electrostatic chuck 145, and helium is supplied through apertures 175 in the chuck to control the temperature of the substrate 25.

A process gas comprising etchant gas for etching the substrate is introduced into the chamber 30 through the gas outlet 85, and the chamber is typically maintained at a pressure ranging from about 0.1 to about 400 mTorr. Suitable etchant gases for etching layers on the substrate 25, include for example, HCl, $BCl_3$, HBr, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The etchant gas is selected to provide high etch rates, and highly selective etching of the particular layers that are being etched. When multiple layers are sequential etched, first, second, third, etc., etchant gas compositions are sequentially introduced into the chamber to etch each particular layer. Referring to FIG. 2, a plasma is energized from the etchant gas using the plasma generator 110 by inductively and/or capacitively coupling energy into the chamber 30. For example, the plasma can be formed by applying an RF source current to the inductor antenna 115 encircling the chamber 30, and applying an RF bias voltage to the electrodes 120, 125. The etchant gas ionizes in the applied electric field to form ions and neutrals that etch the layer on the substrate 25 to form volatile gaseous species that are exhausted from the chamber 30.

The present process allows etching of one or more layers on a substrate 25 and simultaneous cleaning of the plasma etching chamber 30 in which the etching process is performed, without stopping the etching process. In one or more of the etch process stages, a cleaning gas is added to the etchant gas in a volumetric ratio selected so that the etching residue formed in any one of the etching stages; or the residue formed in all of the etching stages is substantially entirely removed during the etching process. Preferably, the etchant gas comprises a gas compound such as one or more of $Cl_2$, $N_2$, $O_2$, HBr, or He—$O_2$; and the cleaning gas comprises a gas compound such as one or more of $NF_3$, $CF_4$, or $SF_6$. It has been discovered that combinations of these gases provide unique and unexpected etching and cleaning properties.

The volumetric flow ratio of cleaning gas to etchant gas is selected to remove the etchant residue generated from processing at least 2000 substrate 25, and more preferably at least 3000 substrates, without performing a separate cleaning step for cleaning the chamber 30 in between processing of the substrates. A suitable volumetric flow ratio of cleaning gas to etchant gas is from about 1:20 to about 1:1, and more preferably from about 1:10 to about 2:3, and most preferably about 2:3. It has been discovered that at these volumetric flow ratios of cleaning gas to etchant gas, substantially all the etchant residues on the chamber surfaces 45, 50, 55 are removed without eroding the chamber surfaces. In addition, it has been unexpectedly discovered that the chamber surfaces are cleaned and conditioned by the etchant and cleaning gas combination step, without requiring a separate chamber conditioning or seasoning step. The synergism of etching the substrate 25 and simultaneously removing the etching residues from the surfaces in the chamber 30 (without terminating the etching process or requiring separate cleaning or conditioning steps) provides significantly improved process stability from substrate to substrate, and increased process throughput.

In one example of the present process, a substrate 25 comprising metal silicide or silicon (i.e., polycrystalline or monocrystalline silicon), is etched using a plasma of process gas comprising $Cl_2$, $N_2$, and $CF_4$, and optionally $O_2$, in a volumetric flow ratio selected to remove substantially all the etch residue formed on the chamber surfaces upon completion of the etching process. Preferably, the volumetric flow ratio of $Cl_2$, $N_2$, and $CF_4$ is selected to remove substantially all the etchant residue generated by etching at least 2000 substrates 25 in the chamber 30, without performing a separate cleaning step for cleaning the chamber. The ratio of the volumetric flow ratio of $CF_4$: $(Cl_2+N_2)$ is more preferably from about 1:20 to about 1:1. In another example, the process uses a process gas comprising $Cl_2$, $N_2$, and $SF_6$, preferably, the volumetric flow ratio of $SF_6$: $(Cl_2+N_2)$ being from about 1:20 to about 1:1. In yet another example, a suitable process gas comprises $Cl_2$, $N_2$, and $NF_3$, preferably, the volumetric flow ratio of $NF_3$: $(Cl_2+N_2)$ being from about 1:20 to about 1:1.

A burst of cleaning gas is introduced into the etching chamber 30 for a short burst of time to treat and condition the chamber surfaces, while the substrate 25 is still being etched by the etchant gas. Process gas comprising etchant gas is introduced into the chamber 30, and the composition of the process gas is adjusted to the desired etchant gas composition to etch one or more of the different layers of material on a substrate. During the etching process, a short burst of cleaning gas is added to the process gas while the substrate is still being etched. For example, the burst of cleaning gas can be added to the etchant gas used to etch a polysilicon layer (during the main etch of the polysilicon layer) and terminated before the polysilicon overetching step. The burst of activated cleaning gas provides a larger number of highly reactive cleaning species that removes the freshly deposited etch residues before they can chemically adhere to the chamber surfaces. Also, a first etchant gas composition can generate a first etch residue that is weakly adhered to the chamber surfaces or that has a chemically soft and reactive composition; however, when second etchant gas is introduced into the chamber, the second etchant gas can react with the first etch residue and make it a chemically hard sticking residue. In these processes, the short burst of cleaning gas is introduced into the chamber during the first stage of the etch process, to remove the freshly generated etch residue before it is chemically changed by exposure to another chemical gas composition. A high flow rate burst and quick removal of the cleaning gas from the chamber 30 also reduces the possibility of the cleaning gas combining to form other chemical species that erode the chamber surfaces and components. This mechanism is further aided by the high flow rates of the burst of gas which flush out reaction byproducts from the chamber 30. Preferably, the burst of activated cleaning gas is introduced into the etching chamber at a flow rate $F_R$ equivalent to a rate of at least about 40 to about 200 sccm for an etching chamber 30 having a volume of about 40,000 cm³ for a time period of about 5 to about 100 seconds to clean the etch residue, substantially without eroding the walls 45, 50, 55 and components in the chamber 30.

After completion of processing, the substrate 25 is dechucked using suitable dechucking means. A pneumatic lifting apparatus 180 raises lift pins through the electrostatic chuck 145 to raise the substrate 25 and a robotic transport arm is inserted between the substrate 25 and the chuck to lift the substrate off the lift pins. Thereafter, the lift pins are retracted into the chuck 145, and the robotic arm transports the first substrate 25 out of the etching chamber 30 and into a transfer chamber maintained in a vacuum environment.

Multiple Etching Stages

Figure 3:
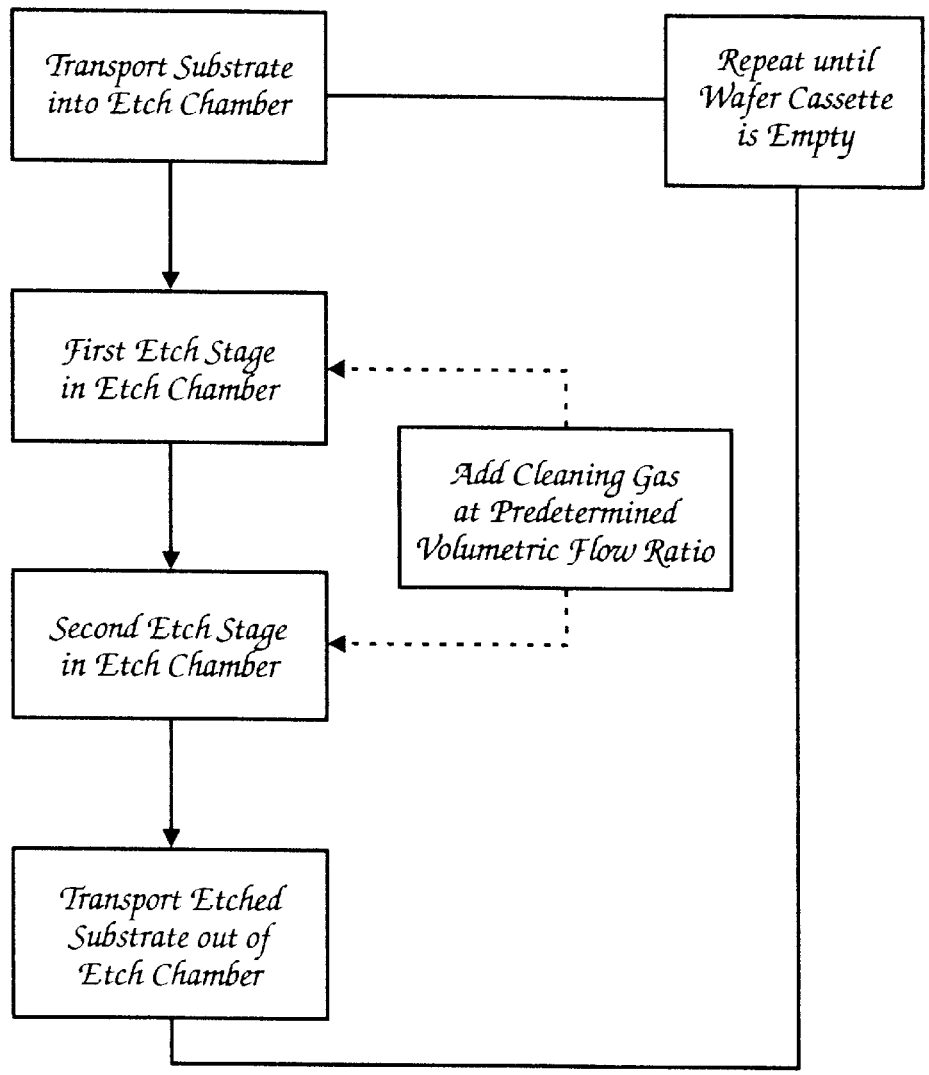
FIG. 3 is a flowchart of the process steps used to etch substrates and simultaneously clean the surfaces of the etching chamber and its components.

In another aspect of the present process, multiple stages are used to etch multiple layers on the substrate, and the cleaning gas is introduced in at least one of the stages to remove the etch residue deposited on the chamber surfaces in one or more of the multiple etching steps, as illustrated in FIG. 3. This process is useful for etching, for example, polycide structures that comprise multiple layers of tungsten silicide and polysilicon layers or for etching silicon nitride layers or silicon dioxide layers on silicon wafers. Although the present process is illustrated in the context of etching such layers, it should be understood that the process can be used to etch other layers such as metal layers and silicon dioxide layers. Thus, the present process should not be limited to the examples and illustrative methods provided herein.

The multi-stage process comprises a plurality of etching stages. In a first etching stage, a first etchant gas is introduced into the process chamber 30, and a plasma is formed from the first etchant gas to etch the first layers on the substrate 25 (for example, a tungsten silicide layer). The first or tungsten silicide layer is typically etched using a first etchant process gas comprising chlorine-containing gases, for example a mixture of chlorine and nitrogen, and optionally oxygen. Preferably, the volumetric flow ratio of chlorine to nitrogen is about 1:3 to about 1:1, and more preferably about 2:3. The pressure in the chamber 30 is maintained at 1 to 10 mTorr, the inductor coil source power level at 200 to 800 Watts, and the process electrodes R.F. bias power level at 20 to 120 watts.

In the second etching stage, a second etchant gas is introduced into the chamber 30, and a plasma is formed to etch the second layers (for example a polysilicon layer below the tungsten silicide layer) after the first layer has completed etching. The second or polysilicon layer can be etched in more than one etching process step, with the etchant gas composition being changed during each etching step. Suitable second etchant gas compositions comprise $Cl_2$ in a flow rate of from 20 to 120 sccm, HBr at about 80 to 240 sccm, and He—$O_2$ at about 2 to 10 sccm. The chamber pressure is from about 25 to 200 mTorr. The power level of the source current applied to the inductor antenna 115 is from about 200 to 800 Watts, and the bias RF power level of the voltage applied to the process electrodes 120, 125 is from about 20 to 120 Watts.

In one or more of the first and second stages, a cleaning gas is added to the etchant gas in a volumetric ratio selected so that the etching residue formed in any one of the stages is substantially entirely removed during the etching process. The etch residue formed in the first and second stages typically comprises polymeric organic compounds containing halogen, carbon, hydrogen, and oxygen. When silicon-containing layers are being etched, the etchant residue comprises predominantly silicon dioxide compounds formed during etching of both the tungsten silicide and polysilicon layers on the substrate 25. However, the composition of etch residue can vary from the first to the second layer, the first etch residue composed more of W and Si species, and the second etch residue composed more of Si and O species. Thus the cleaning gas is added to the process gas in the first or second stage, in a volumetric ratio suitable for removing the first etch residue formed in the first etching stage in which the tungsten silicide layer was etched, as well as the second etch residue formed during the second etching stage in which the polysilicon layer was etched. It has been discovered that a suitable volumetric flow ratio of cleaning gas to etchant gas is from about 1:10 to about 2:3. For example, to a flow rate of first etchant gas of about 80 sccm $Cl_2$ and 40 sccm $N_2$, was added a cleaning gas comprising $CF_4$ at a flow rate of 80 sccm, to provide a volumetric ratio of cleaning gas to first etchant gas of about 2:3. It has been discovered that at these volumetric flow ratios of cleaning gas to etchant gas, substantially all the etchant residues on the chamber surfaces (which are formed during the different stages of the etching process) are removed without eroding the chamber surfaces. In addition, it has been unexpectedly discovered that the chamber surfaces are cleaned and conditioned by the etchant and cleaning gas combination, without requiring a separate seasoning or conditioning process step.

The chamber treatment process of the present invention has been found to uniformly remove etch residues, irrespective of their thickness or chemical stoichiometry, during performance of an etching process. Prior art cleaning processes, particularly those performed by an operator, often fail to uniformly clean and remove the etch residue deposits formed on chamber surfaces. Build-up of etchant deposits on the chamber surfaces, result in flaking off the etchant deposits and contamination of the substrate 25 etched in the chamber. By uniformly removing the etch residues formed across substantially all of the chamber surfaces, such contamination and resultant reduced substrate 25 yields, are substantially minimized.

The cleaning gas also results in much less erosive damage to the chamber compared to conventional in-situ plasma cleaning steps, because of the reduced energy levels of the plasma in the etching chamber. This was difficult to accomplish in prior art processes, in which high powered plasmas used to remove the residue deposits also resulted in extensive erosion of chamber surfaces and components. By reducing the need to replace chamber components, the cost of operating the chamber 30 and the cost per substrate 25 are significantly reduced. Furthermore, the activated cleaning gas can be used to efficiently clean an chamber 30 in-situ during etching of substrates 25, rather than stopping processing to wet clean the chamber walls and components, thereby increasing etching throughput and further reducing costs per substrate. The cleaning process is expected to increase chamber lifetimes by a factor of at least 2, and also increase substrate yields by reducing the deposition of flaked-off etchant byproducts onto the substrate.

The cleaning process removes chemically-adhered etchant deposits from the surfaces in the chamber 30, and restores the original chemical reactivity and surface functional groups of these surfaces, without requiring a chamber conditioning process after the cleaning process. The cleaning and treatment process is also particularly useful for cleaning etch residue that is strongly adhered to, or chemically reacted with chamber surfaces. The cleaning gas is effective at treating and reconditioning these ceramic surfaces to provide surface chemistries and surface functional groups that are chemically compatible with the etching process. The conditioned ceramic surfaces provide more reproducible etching properties in the chamber 30, than that provided by alternative chamber cleaning processes, such as wet cleaning or RIE cleaning processes. The significantly improved reproducibility of etching processes performed in the chamber 30 is highly desirable.

EXAMPLE 1

Continuous Etching of 3000 Wafers Without Cleaning Chamber

The following examples demonstrate the effectiveness of the etching and cleaning processes according to the present invention. In these examples, a Silicon DPS process chamber, commercially available from Applied Materials, Santa Clara, Calif., was used to etch polycide layers on a substrate. In these examples, the substrates comprised a silicon wafer comprising an underlayer of 1000 Å of $SiO_2$, covered by a polycide layer comprising 3000 Å polysilicon and 3000 Å $WSi_x$. Over 3000 wafers were sequentially etched in the etching chamber 30, and the etched properties of the features, etching rates, and etching selectivity ratios measured from time to time.

The tungsten suicide etching process used a flow rate of first etchant gas comprising 80 sccm $Cl_2$ and 40 sccm $N_2$. To the first etchant gas was added a cleaning gas comprising $CF_4$ at a flow rate of 80 sccm, which provides a volumetric flow ratio of cleaning gas to etchant gas of about 2:3. The pressure in the chamber was maintained at 4 mTorr, the inductor coil source power level at 600 Watts and the process electrode R.F. bias power level at 60 watts.

The polysilicon layers on the substrate 25 were etched in two stages, including a main etch stage and an "overetch" stage, in order to stop the etching process without etching through the silicon dioxide underlayer on the substrate. The main etch stage was stopped immediately before the polysilicon layer was completely etched through, and the overetch stage is performed to etch through the residual portion of the polysilicon layer. Typically, the halogen content of the etchant gas was reduced in the overetch stage to obtain slower and more controllable etch rates. For example, in the main etching stage, the polysilicon layer was etched using an etchant gas comprising 60 sccm $Cl_2$, 140 sccm HBr, and 5 sccm He—$O_2$; the power level of the source current applied to the inductor antenna 115 was at 480 Watts, and the bias RF power level of the voltage applied to the process electrodes 120, 125 was at 64 Watts. In the over-etch process stage, the etchant gas comprised 90 sccm HBr and 5 sccm He—$O_2$; a chamber pressure of 50 mTorr; a source power level of 400 Watts; and a RF bias power level of 140 Watts.

Figure 4A:
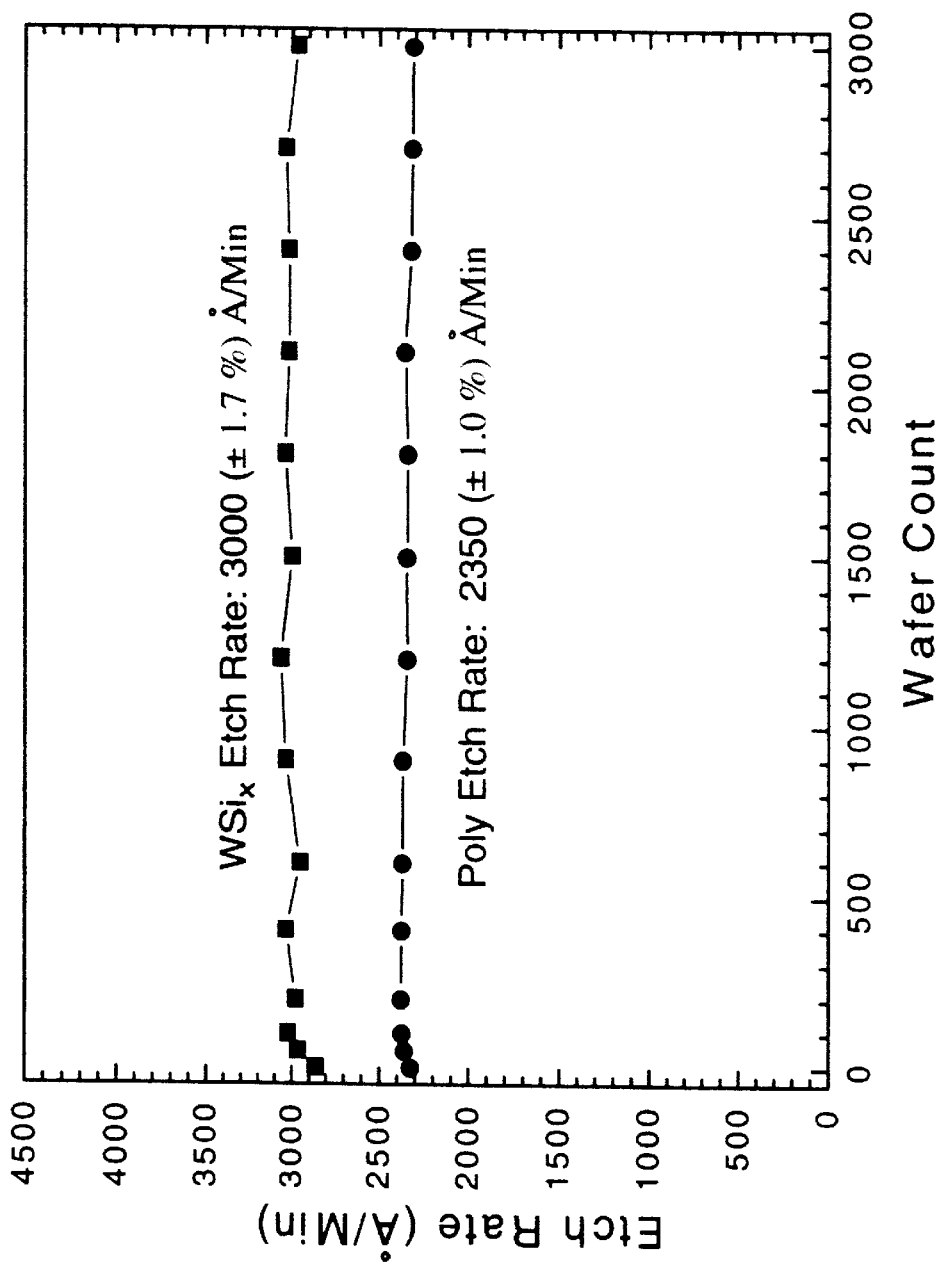
FIGS. 4a and 4b are graphs showing the $WSi_x$ and polysilicon etch rate, and $WSi_x$ to polysilicon etching selectivity ratio, respectively, for processing a batch of 3000 wafers without cleaning the chamber.

One unexpected discovery was that the combination of etchant and cleaning gases provided unexpectedly high etching rates and etching selectivity ratios, for etching of tungsten silicide relative to polysilicon, in the first stage of the process. FIG. 4a shows the tungsten silicide and polysilicon etch rates for the 3000 wafers consecutively processed in the etching chamber. Prior art etching processes required cleaning and conditioning of the chamber after processing of 200 to 300 wafers, because of the variation in etching rates and etching selectivity ratio and the higher particle contamination levels that resulted from etch residue deposits on the chamber surfaces, after processing such a large number of wafers. In contrast, the present etching and simultaneous cleaning process provided consistently high and uniform tungsten silicide etch rates of 3000 Å/min and a variation in etch rate of about 1.7%, during continuous etching of 3000 wafers without cleaning the chamber 25. Similarly, the polysilicon etch rate was maintained at a high rate of about 2350 Å/min.

Figure 4B:
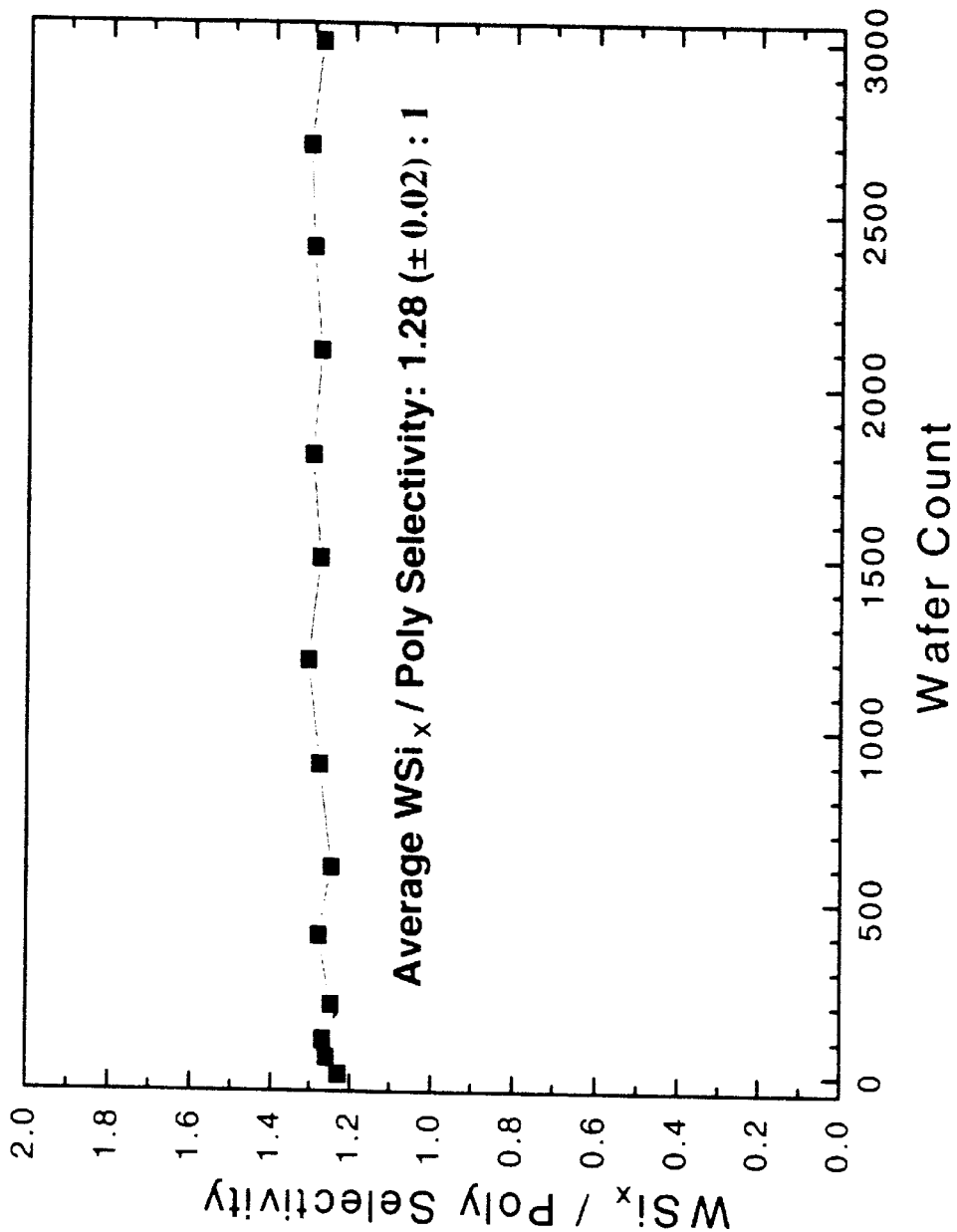

It was discovered that the etchant and cleaning gas also provided uniform and consistent etching rates for etching the tungsten silicide and polysilicon for processing of over 3000 wafers. The tungsten silicide and polysilicon etch rate uniformity was measured for a 3000 wafer process cycle. The tungsten silicide etch rate varied by less than 8% and the polysilicon etch rate varied by less than 2%. In addition, it was discovered that the etchant and cleaning gas provided an etching selectivity ratio of 1.2 for etching tungsten silicide relative to polysilicon, which was at least 50% higher than etching selectivity ratios of prior art polycide etching processes which are typically from 0.6 to 0.8. For example, FIG. 4b shows the average tungsten silicide to polysilicon etching selectivity ratio ranges is about 1.3:1 for the 3000 wafer batch. In addition, the etching selectivity ratio varied by only about 0.02 from wafer to wafer for etching of all 3000 wafers.

Figure 5A:
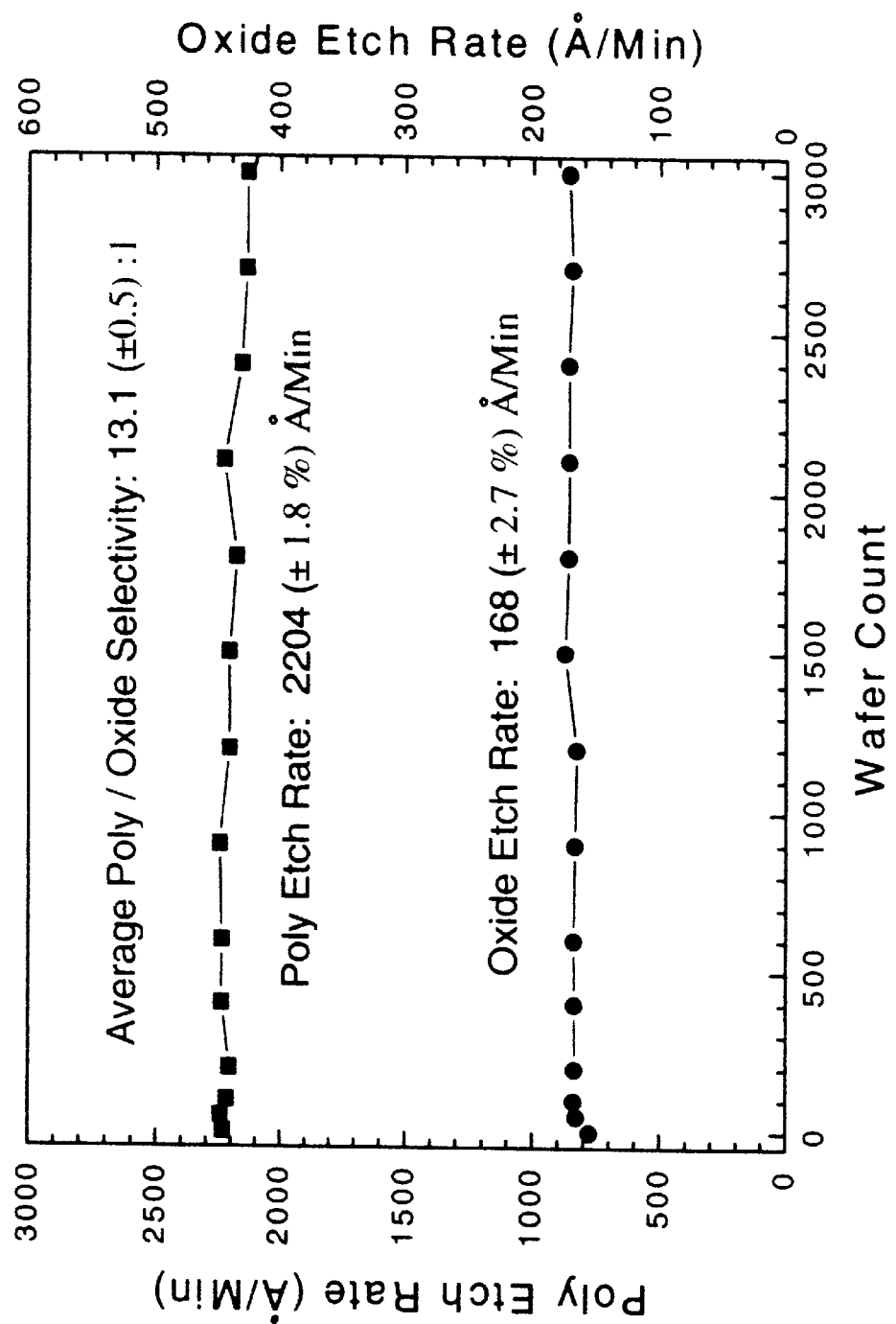
FIGS. 5a and 5b are graphs showing the polysilicon and silicon dioxide etch rate, and polysilicon overetch rate stability, respectively, for processing a batch of 3000 wafers without cleaning the chamber.
Figure 5B:
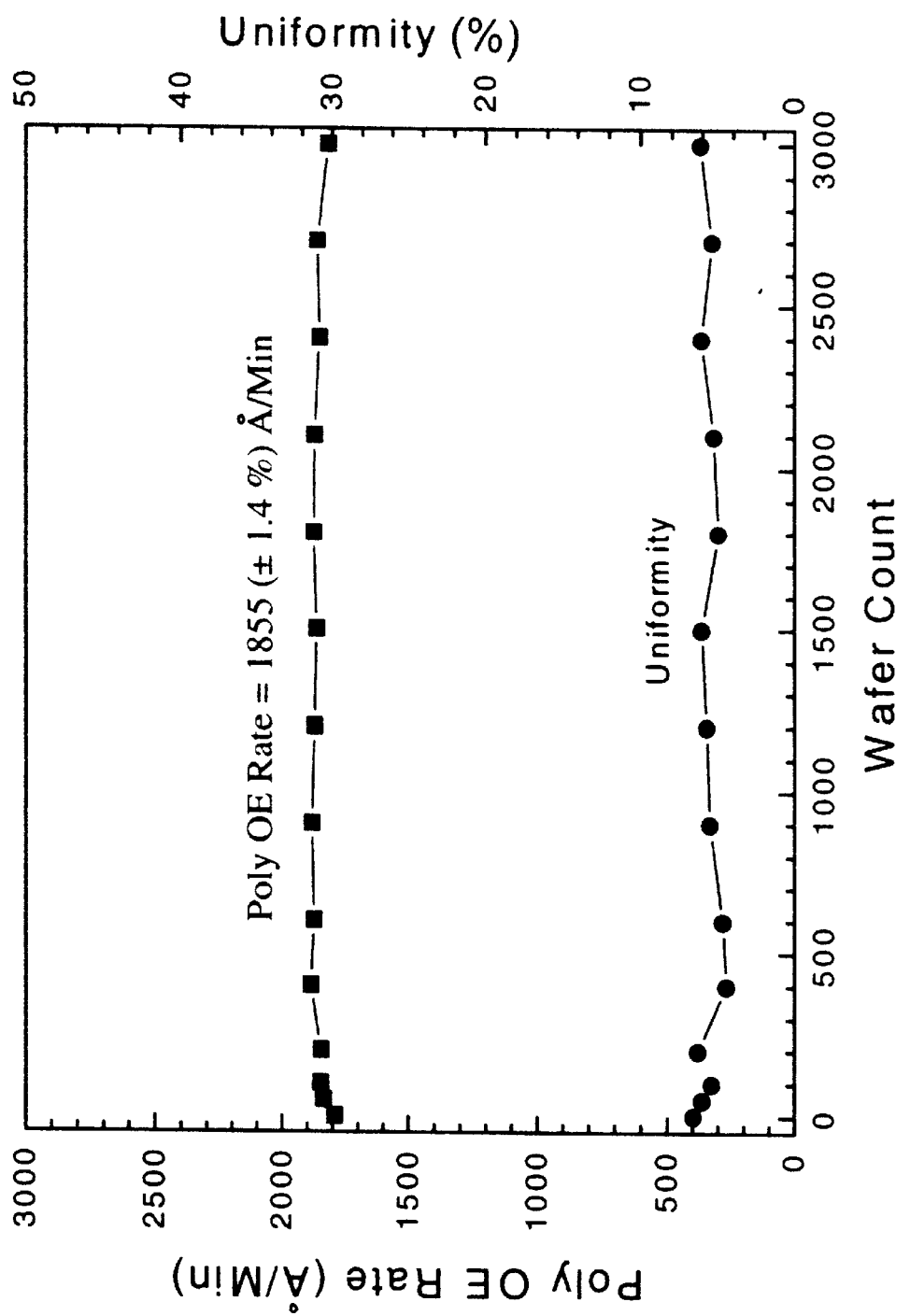

It was further discovered that very high polysilicon to silicon dioxide etch rates and etching selectivity ratio were obtained, and also that the polysilicon etch rate was relatively uniform for etching of 3000 wafers, during the second stage of the process. As shown in FIG. 5a, a polysilicon etch rate of 2204 Å/min was obtained, and an extremely low silicon dioxide etch rate of 168 Å/min was obtained. These results provided a very high average polysilicon to silicon oxide etching selectivity ratio of 13:1, which meant that the underlying silicon dioxide layer was not at all etched during etching of the overlying polysilicon layer. This high etching selectivity ratio was highly desirable to prevent overetching and breakthrough of the underlying electrically insulating silicon dioxide layer. FIG. 5b further demonstrates the stability and uniformity of the etching rate for etching polysilicon layers on the substrate. It was seen that the polysilicon overetch rate of 1855 Å/minute was obtained, and the uniformity of the polysilicon overetch rate was less than 6% during the entire 3000 wafer batch process.

Figure 6:
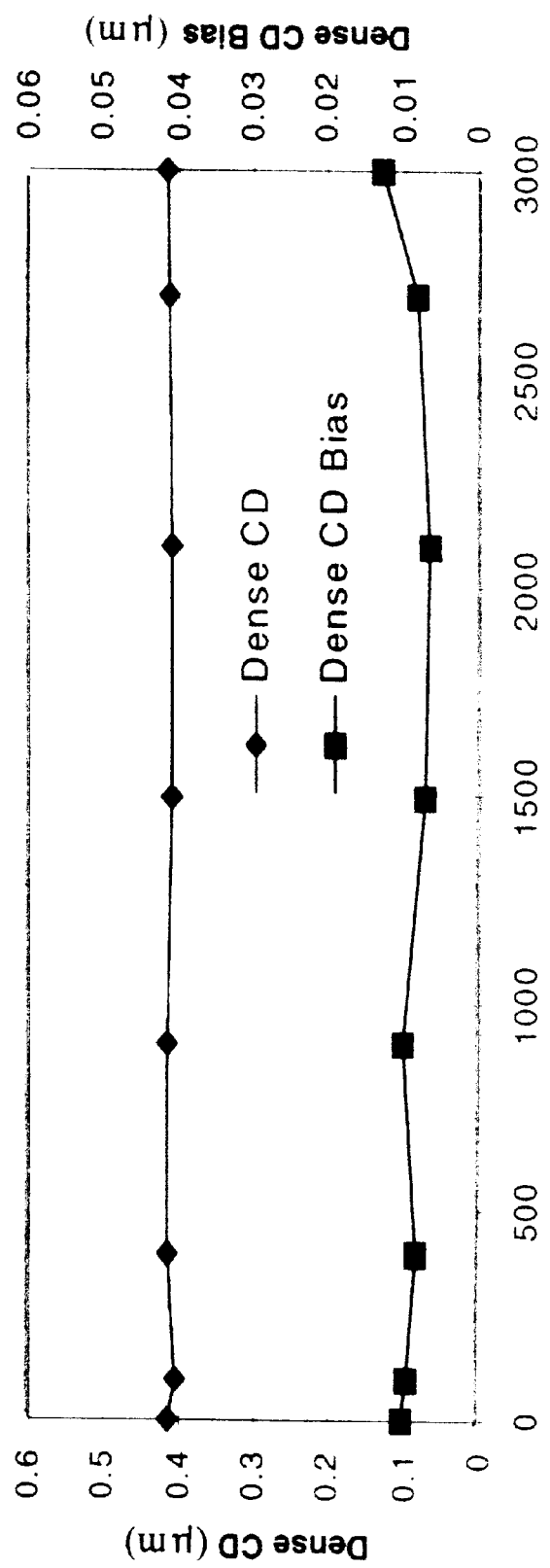
FIG. 6 is a graph showing the variations in critical dimensions for the etched features on the wafers.

The variations in critical dimensions for the etched features on the wafers was also measured, as shown in FIG. 6. Conventional etching processes often fail to maintain the critical dimensions which are predefined and desirable dimensions of the etched features used to determine the electrical properties of the etched features in the design of integrated circuits. In newer integrated circuits, the line widths of interconnect lines and diameters of contact plugs are becoming increasingly smaller than 0.25 microns, to accommodate higher circuit densities. Because the electrical resistance of these features is proportional to the cross-sectional area of the etched features, it is important to maintain consistent and uniform dimensions without variations from feature to feature. Tapering cross-sections and cross-sectional profiles that vary as a function of the spacing of the features are no longer acceptable in these integrated circuits.

The critical dimensions are typically measured as a ratio or difference between the width $W_r$ of the resist features and the width $W_e$ of the etched features. The closer the width of the etched feature to that of the resist feature the more predictable and reliable are the electrical properties of the etched feature. In the present examples, as shown in FIG. 6, the densely packed feature portion of the substrate (which had closely spaced etched features), exhibited a critical dimension of about 0.4 microns, and a critical dimension bias of about 0.04 microns. The 3σ standard deviation level of the critical dimension, from wafer to wafer, was about 0.009 microns, which was also extremely low and indicative of uniform and consistent etch properties across the substrate.

Figure 7A:
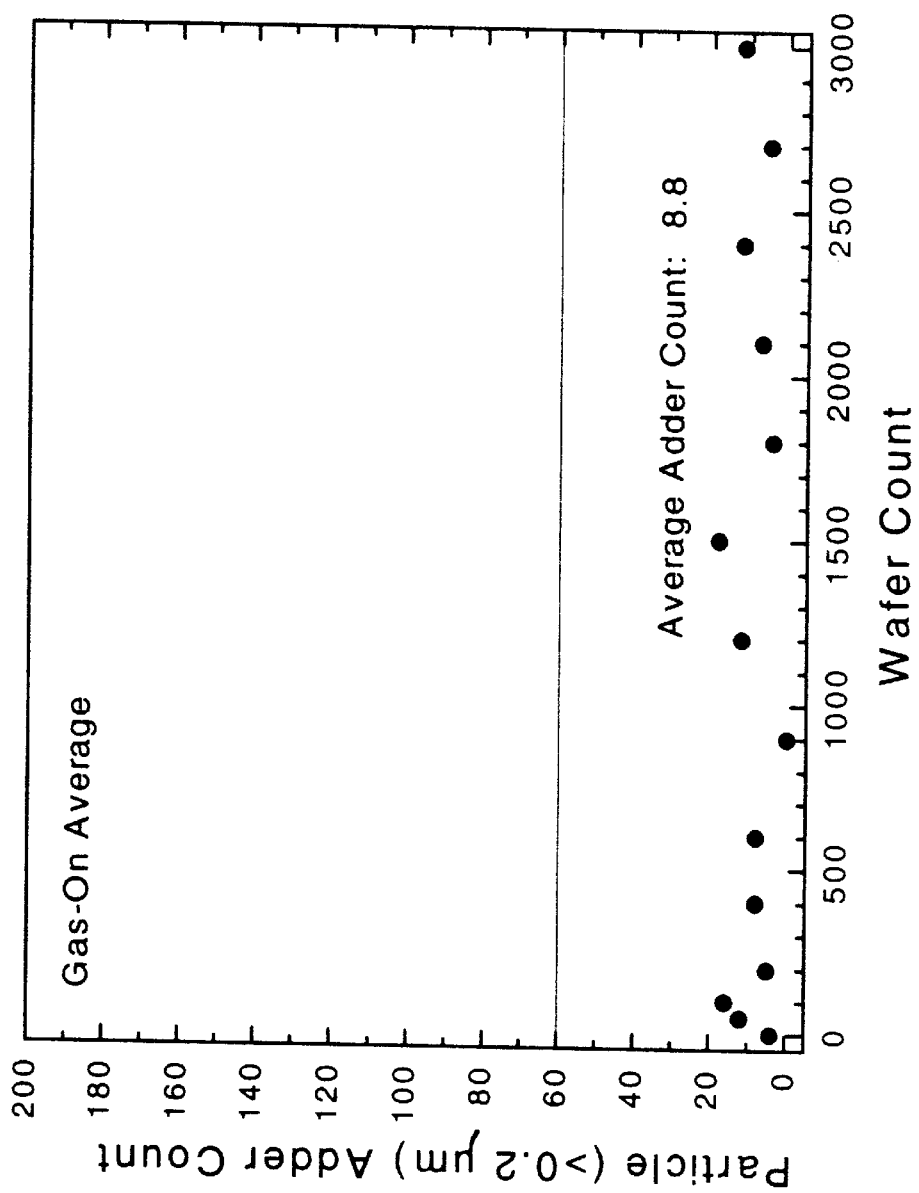
FIGS. 7a and 7b are graphs showing the average Adder particle levels for processing a batch of 3000 wafers without cleaning the chamber.
Figure 7B:
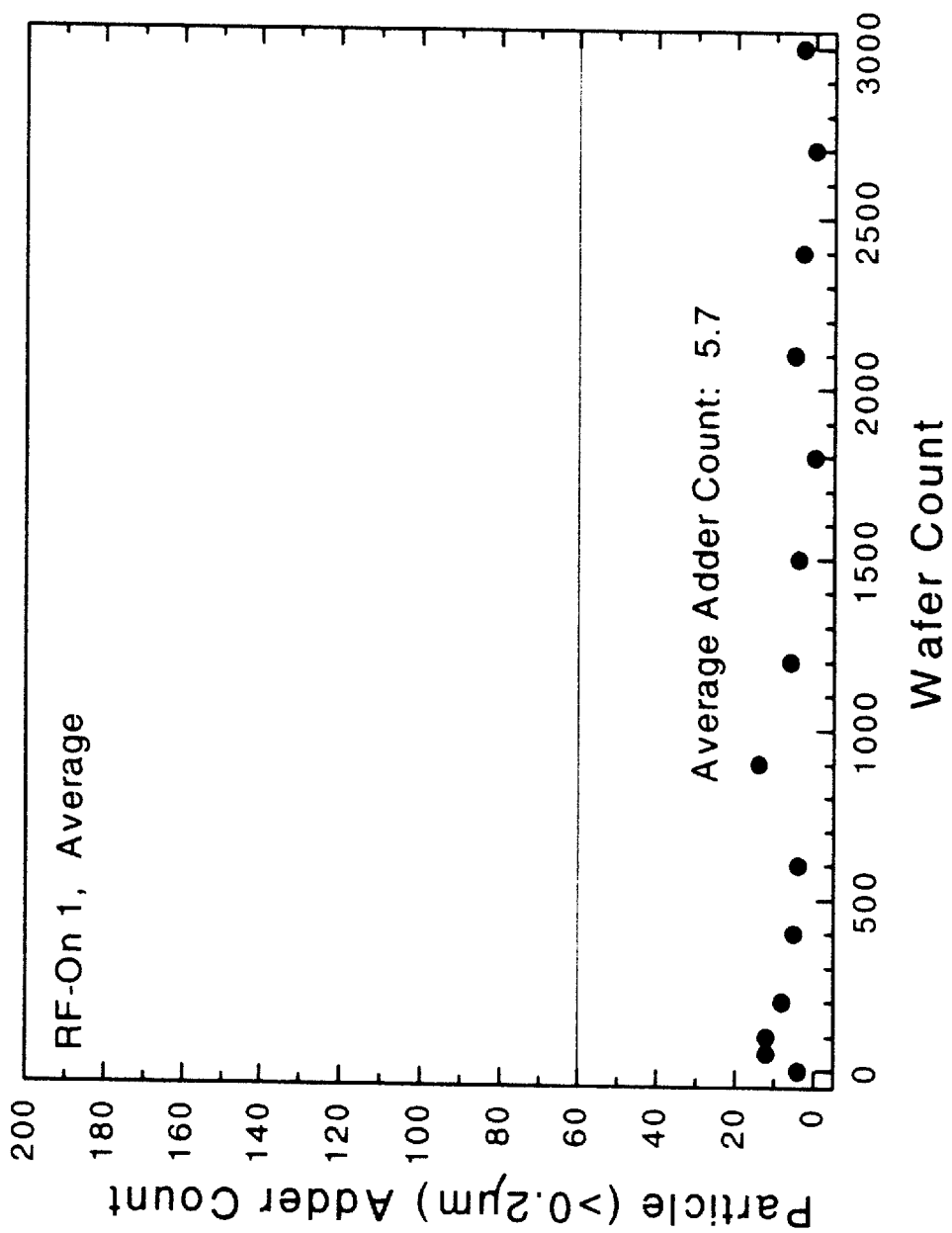

During etching of over 3000 wafers in the chamber 30, the contaminant particles flaking off from the etch residue formed on the chamber surfaces, were measured at predetermined at intervals of time, for example, after each lot of twenty-five substrates 25 had completed etching. The particle contamination levels when measured using a TENCOR Surfscan 6200 with a 3 mm edge exclusion. FIG. 7a shows the average count for contaminant particles, when process gas comprising 80 sccm $CF_4$, 80 sccm $Cl_2$, and 40 sccm $N_2$ was flowed into the chamber 30. The contaminant particle counts averaged about 8.8, which was 5 to 6 times lower than the prior art Adder counts of about 60 particles obtained in conventional etching processes. FIG. 7b shows the Adder contaminant particle levels for a plasma of a process gas comprising 80 sccm $CF_4$, 80 sccm $Cl_2$, and 40 sccm $N_2$; for which an average count of 5.7 was obtained, which was ten times lower than the prior art processes. In addition to the Adder particle counts, the etching chamber surfaces were visually examined for etchant residue deposits. It was discovered that even after etching 3000 wafers, the chamber surfaces were pristine clean with no etch residues left on the chamber surfaces. It was further discovered that substantially no dry or wet cleaning process was needed to clean, seasoning or condition the chamber walls, even after etching of 3000 wafers, which is about 3 to 10 times as many wafers as that etched in prior art processes without cleaning of the chamber.

EXAMPLE 2 to 7

Comparative Examples With High Etching Selectivity Ratios and Etching Rates

In these examples, silicon wafers having successive layers of $SiO_2$, polysilicon, $WSi_x$, and resist were etched using gas mixtures of $Cl_2$—He—$O_2$, and with or without addition of a cleaning gas of $CF_4$. Table I shows the process conditions used in the baseline processes and the $CF_4$ addition processes, along with the results measured for etching selectivity ratio, and $WSi_x$ and polysilicon etching rates. In all of the examples, the etchant gas comprised 100 sccm $Cl_2$. The additional etchant and cleaning gases, as listed in Table I, include He—$O_2$, and optionally $CF_4$. The pressure in the chamber was maintained at 4 or 9 mTorr, the source power level at 300 or 500 watts, the process electrode R.F. bias power level at 60 watts, and the temperature of the substrate at 50° C. The properties of the etched features, etching rates, and etching selectivity ratios were measured using conventional SEM methods.

TABLE I

| $HeO_2$ | $CF_4$ | P | Ws | Resist Selectivity Ratio | WSi to Polysilicon Selectivity Ratio | WSi Etching Uniformity (%) | Polysilicon Etching Uniformity (%) |
|---|---|---|---|---|---|---|---|
| 5 | 0 | 9 | 500 | 0.90 | 1.09 | 3.09 | 3.02 |
| 5 | 20 | 9 | 500 | 1.17 | 1.25 | 2.87 | 2.20 |
| 5 | 40 | 9 | 300 | 1.08 | 1.19 | 3.19 | 2.59 |
| 5 | 20 | 4 | 500 | 1.08 | 1.33 | 2.05 | 3.19 |

TABLE I-continued

| HeO$_2$ | CF$_4$ | P | Ws | Resist Selectivity Ratio | WSi to Polysilicon Selectivity Ratio | Wsi Etching Uniformity (%) | Polysilicon Etching Uniformity (%) |
|---|---|---|---|---|---|---|---|
| 0 | 0 | 9 | 500 | 0.83 | 1.01 | 3.53 | 2.62 |
| 10 | 20 | 9 | 500 | 1.17 | 1.23 | 2.78 | 2.29 |

Table I demonstrates that the combination of Cl$_2$, He—O$_2$, and CF$_4$ in Examples 3 and 7, provided unexpectedly high etching selectivity ratios for etching of tungsten silicide relative to resist, of greater than about 1.1. This etching selectivity ratio is 20% higher than the ratio provided by the conventional etching processes of Examples 2 and 6 that used only Cl$_2$ or Cl$_2$, and HeO$_2$, which were about 0.8 to 0.9.

Table I further shows that the combination of Cl$_2$, He—O$_2$, and CF$_4$ in Examples 3, 5, and 7, also provided unexpectedly high etching selectivity ratios for etching of tungsten silicide relative to polysilicon, of greater than about 1.2. These etching selectivity ratios were 50% higher than the etching processes of Examples 2 and 6 that used only Cl$_2$ or Cl$_2$ and HeO$_2$, and that provided etching selectivity ratios of 0.8 to 0.9.

Prior art etching processes also resulted in significant variations in etching rates of WSi$_x$ and polysilicon across the surface of the substrate. In contrast, the present etching and cleaning process provided consistent high and uniform tungsten silicide and polysilicon etch rates across the substrate. As shown in Table I, the variation in uniformity of etch rates for the WSi$_x$ layer was as low as 2% (Example 5) in contrast to etching variations of greater than 3 to 3.5% of conventional processes, as demonstrated in Examples 2 and 6. The variation in uniformity etch rates for the polysilicon layer was as low as 2.2% (Example 3) in contrast to etching variations of greater than 2.6 to 3% of conventional processes, as demonstrated in Examples 2 and 6. In these examples, the uniformity of the WSi$_x$ and polysilicon etch rates was determined from:

(Maximum Etch Rate—Minimum Etch Rate)/(2×Average Etch Rate)×100%. The etch rates were measured from multiple points on SEM cross-sectional micrographs of etched features of WSi$_x$ and polysilicon.

EXAMPLE 8

Figure 1A:
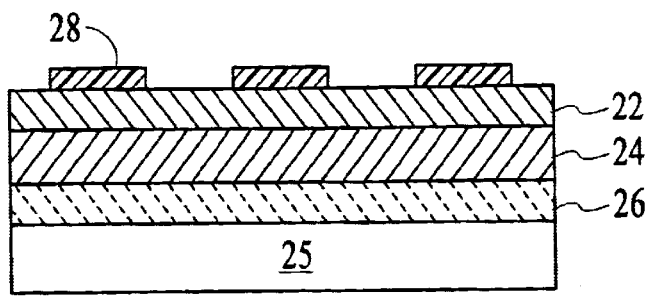
FIG. 1a is a schematic cross-section of a substrate having silicon dioxide, polysilicon, metal silicide and resist layers.
Figure 1B:
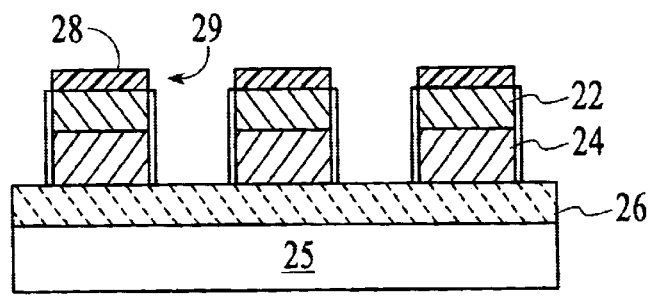
FIG. 1b is a schematic cross-section of the substrate of FIG. 1a after etching of the metal silicide and polysilicon layers.
Figure 1C:
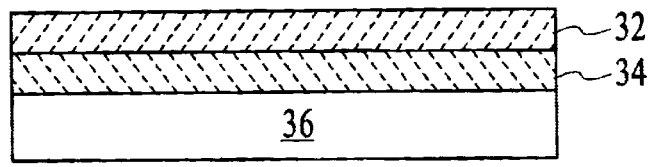
FIG. 1c is a schematic cross-section of a silicon or polysilicon substrate having a mask layer of silicon nitride.
Figure 1D:
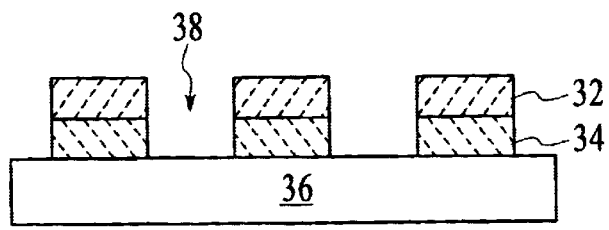
FIG. 1d is a schematic cross-section of the substrate of FIG. 1c after etching of trenches in the silicon or polysilicon.

In this example, a silicon nitride layer 32 on a silicon dioxide layer 34, was etched to form a mask (prior to a shallow trench 38 isolation of the underlying silicon 36) as shown in FIGS. 1c and 1d. A plasma of Cl$_2$, O$_2$, and SF$_6$ was used to etch the silicon nitride layer 32, while simultaneously cleaning the chamber walls. Shallow trench isolation involves forming a shallow trench 38 in the silicon substrate 36 and then filling it with silicon oxide or polysilicon to isolates two or more adjacent devices formed in the same silicon substrate (not shown). In forming these trenches a layer of silicon nitride 32 is deposited over a silicon dioxide layer 34 on the silicon substrate 36, patterned using conventional photolithographic techniques, and then etched by the process of the present invention to form a silicon nitride mask. The silicon substrate is etched to form the shallow trench which is then filled silicon oxide or polysilicon. Thereafter, the MOSFET devices are formed using standard CMOS processing methods.

Preferably, the volumetric flow of Cl$_2$: O$_2$: SF$_6$ is selected to provide high etching selectivity ratios for etching silicon nitride to silicon dioxide, and to remove substantially all the etchant residue generated by etching at least 2000 substrates in the chamber, without performing separate cleaning steps for cleaning the chamber. It has further been discovered that high silicon-nitride etch rates were obtained, and that the silicon-nitride etch rate was relatively uniform for sequential etching of large numbers of wafers. The high silicon-nitride to silicon oxide etching selectivity ratio means that the underlying silicon dioxide layer is not substantially etched during etching of the overlying silicon-nitride layer. This high etching selectivity ratio is desirable to prevent overetching and "breakthrough" of the underlying electrically insulating silicon dioxide layer.

The present invention has been described with reference to certain preferred versions thereof; however, other versions are possible. For example, the treatment and cleaning process of the present invention can be used for treating chambers for other applications, as would be apparent to one of ordinary skill. For example, the process can be applied, as would be apparent to one of ordinary skill in the art, to treat sputtering chambers, ion implantation chambers, or deposition chambers, or in combination with other cleaning processes. Therefore, the spirit and scope of the appended claims should not be limited to the description of the preferred versions contained herein.

What is claimed is:

1. A substrate processing method comprising:
   (a) placing a substrate in a chamber, the substrate having a layer thereon;
   (b) providing an energized etchant gas in the chamber to etch substantially through the layer, the etchant gas comprising a first halogen containing gas compound having a first halogen;
   (c) during (b), providing an energized cleaning gas to substantially clean the chamber, the cleaning gas comprising a second halogen containing gas compound having a second halogen that is other than the first halogen;
   (d) removing the etched substrate from the chamber, and
   (e) repeating (a), (b), (c) and (d) without performing a separate cleaning step to clean the chamber.

2. A method according to claim 1 wherein the etchant gas comprises one or more of Cl$_2$, N$_2$, O$_2$, HBr and He—O$_2$.

3. A method according to claim 1 wherein the etchant gas comprises a halogen-containing gas and one or more of N$_2$, HBr, O$_2$ or He—O$_2$.

4. A method according to claim 1 wherein the cleaning gas comprises one or more of CF$_4$, NF$_3$ and SF$_6$.

5. A method according to claim 1 wherein the cleaning gas comprises one or more of CF$_4$ and SF$_6$.

6. A method according to claim 1 wherein (c) comprises providing a burst of energized cleaning gas during (b).

7. A method according to claim 1 wherein (c) comprises providing a volumetric flow ratio of cleaning gas to etchant gas of from about 1:20 to about 1:1.

8. A method according to claim 1 wherein the etchant gas comprises Cl$_2$ and N$_2$, and wherein the cleaning gas comprises CF$_4$.

9. A method according to claim 8 wherein the ratio of the volumetric flow of CF$_4$: (Cl$_2$+N$_2$) is from about 1:20 to about 1:1.

10. A method according to claim 1 wherein the layer comprises one or more of monocrystalline silicon, metal silicide, silicon dioxide and silicon nitride.

11. A method according to claim 1 wherein (a), (b), (c) and (d) are repeated to sequentially process a batch of at least 2000 substrates.

12. A method according to claim 11 wherein (a), (b), (c), and (d) are repeated to sequentially process a batch of at least 3000 substrates.

13. A substrate processing method comprising:
(a) placing a substrate in a chamber, the substrate having a layer thereon;
(b) providing an energized etchant gas in the chamber to etch the layer, the energized etchant gas being provided before etchant residue from the layer has been formed on the chamber surfaces, the etchant gas comprising a first halogen containing gas compound comprising a first halogen;
(c) during (b), providing an energized cleaning gas to substantially clean the chamber, the cleaning gas comprising a second halogen containing gas compound comprising a second halogen that is other than the first halogen;
(d) removing the etched substrate from the chamber; and
(e) repeating (a), (b), (c) and (d) to sequentially process a batch of at least 2000 substrates.

14. A method according to claim 13 wherein the etchant gas comprises one or more of $Cl_2$, $N_2$, $O_2$, HBr and He—$O_2$.

15. A method according to claim 13 wherein the etchant gas comprises a halogen-containing gas and one or more of $N_2$, HBr, $O_2$ or He—$O_2$.

16. A method according to claim 13 wherein the cleaning gas comprises one or more of $CF_4$, $NF_3$ and $SF_6$.

17. A method according to claim 13 wherein the cleaning gas comprises one or more of $CF_4$ and $SF_6$.

18. A method according to claim 13 wherein (c) comprises providing a burst of energized process gas during (b).

19. A method according to claim 13 wherein (c) comprises providing a volumetric flow ratio of cleaning gas to etchant gas of from about 1:20 to about 1:1.

20. A method according to claim 13 wherein the etchant gas comprises $Cl_2$ and $N_2$, and wherein the cleaning gas comprises $CF_4$.

21. A method according to claim 20 wherein the ratio of the volumetric flow of $CF_4$: ($Cl_2+N_2$) is from about 1:20 to about 1:1.

22. A method according to claim 13 wherein the substrate comprises one or more of monocrystalline silicon, metal silicide, silicon dioxide and silicon nitride.

23. A method according to claim 13 wherein (a), (b), (c) and (d) are repeated to sequentially process a batch of at least 3000 substrates.

24. A method according to claim 13 wherein (a), (b), (c) and (d) are repeated without performing a separate cleaning step to clean the chamber.

25. A substrate processing method comprising:
(a) placing a substrate in a chamber;
(b) providing a first energized etchant gas in the chamber to etch the substrate;
(c) providing a second energized etchant gas in the chamber to etch the substrate; and
(d) during one or more of (b) and (c), providing a burst of energized cleaning gas to substantially clean the chamber surfaces,
wherein one or more of the first and second etchant gases comprises a first halogen containing gas compound comprising a first halogen, and wherein the cleaning gas comprises a second halogen containing gas compound comprising a second halogen that is other than the first halogen.

26. A method according to claim 25 wherein the first or second etchant gas comprises one or more of $Cl_2$, $N_2$, $O_2$, HBr and He—$O_2$.

27. A method according to claim 25 wherein the first or second etchant gas comprises a halogen-containing gas and one or more of $N_2$, HBr, $O_2$ or He—$O_2$.

28. A method according to claim 25 wherein the cleaning gas comprises one or more of $CF_4$, $NF_3$ and $SF_6$.

29. A method according to claim 25 wherein the cleaning gas comprises one or more of $CF_4$ and $SF_6$.

30. A method according to claim 25 wherein (c) comprises providing a volumetric flow ratio of cleaning gas to the first or second etchant gas of from about 1:20 to about 1:1.

31. A method according to claim 25 wherein the first or second etchant gas comprises $Cl_2$ and $N_2$, and wherein the cleaning gas comprises $CF_4$.

32. A method according to claim 31 wherein the ratio of the volumetric flow of $CF_4$: ($Cl_2+N_2$) is from about 1:20 to about 1:1.

33. A method according to claim 25 wherein the substrate comprises one or more of monocrystalline silicon, metal silicide, silicon dioxide and silicon nitride.

34. A substrate processing method comprising:
(a) placing a substrate in a chamber;
(b) providing an energized etchant gas in the chamber to etch the substrate, the etchant gas comprising a first halogen containing gas compound having a first halogen;
(c) during (b), providing a burst of energized cleaning gas to substantially clean the chamber surfaces, the cleaning gas comprising a second halogen containing gas compound having a second halogen that is other than the first halogen; and
(d) repeating (a), (b), and (c).

35. A method according to claim 34 wherein the etchant gas comprises one or more of $Cl_2$, $N_2$, $O_2$, HBr and He—$O_2$.

36. A method according to claim 34 wherein the etchant gas comprises a halogen-containing gas and one or more of $N_2$, HBr, $O_2$ or He—$O_2$.

37. A method according to claim 34 wherein the cleaning gas comprises: one or more of $CF_4$, $NF_3$ and $SF_6$.

38. A method according to claim 34 wherein the cleaning gas comprises one or more of $CF_4$ and $SF_6$.

39. A method according to claim 34 wherein (c) comprises providing a volumetric flow ratio of cleaning gas to etchant gas of from about 1:20 to about 1:1.

40. A method according to claim 34 wherein the etchant gas comprises $Cl_2$ and $N_2$, and wherein the cleaning gas comprises $CF_4$.

41. A method according to claim 40 wherein the ratio of the volumetric flow of $CF_4$: ($Cl_2+N_2$) is from about 1:20 to about 1:1.

42. A method according to claim 34 wherein the substrate comprises one or more of monocrystalline silicon, metal silicide, silicon dioxide, and silicon nitride.

43. A substrate processing method comprising:
(a) placing a substrate in a chamber;
(b) providing a first energized etchant gas in the chamber to etch the substrate, the first energized etchant gas comprising a chlorine-containing gas or a bromine-containing gas;
(c) providing a second energized etchant god in the chamber to etch the substrate; and
(d) during one or more of (b) and (c), providing a burst of energized cleaning gas comprising fluorine species to clean the chamber surfaces.

44. A method according to claim 43 wherein the cleaning gas comprises one or more of $CF_4$, $NF_3$ and $SF_6$.

45. A method according to claim 43 wherein the cleaning gas comprises one or more of $CF_4$ and $SF_6$.

46. A method according to claim 43 wherein (c) comprises providing a volumetric flow ratio of cleaning gas to the first or second etchant gas of from about 1:20 to about 1:1.

47. A method according to claim 43 wherein the first or second etchant gas comprises $Cl_2$ and $N_2$, and wherein the cleaning gas comprises $CF_4$.

48. A method according to claim 47 wherein the ratio of the volumetric flow of $CF_4$ ($Cl_2 + N_2$) is from about 1:20 to about 1:1.

49. A substrate processing method comprising:
   (a) placing a substrate in a chamber;
   (b) providing an energized etchant gas in the chamber to etch the substrate;
   (c) providing a burst of energized cleaning gas in the chamber to clean the chamber surfaces, the energized cleaning gas comprising one or more of (i) carbon and fluorine species and (ii) sulfur and fluorine species; and
   (d) after (c), removing the substrate from the chamber.

50. A method according to claim 49 wherein the cleaning gas comprises one or more of $CF_4$ and $SF_6$.

51. A method of processing a substrate, the method comprising:
   (a) placing the substrate in a process zone of a chamber;
   (b) providing in the process zone an energized process gas comprising an etchant gas and a cleaning gas in a volumetric flow ratio of cleaning gas to etchant gases sufficiently high to at least partially remove etchant residue deposited on surfaces in the chamber, the etchant gas comprising a first halogen containing gas and one or more of a second halogen containing gas, $N_2$, $O_2$, and He—$O_2$, and the cleaning gas comprising fluorine species;
   (c) removing the etched substrate from the chamber; and
   (d) repeating (a), (b), and (c) without performing a separate cleaning step to clean the chamber.

52. A method according to claim 51 wherein the cleaning gas comprises one or more of $NF_3$, $CF_4$, or $SF_6$.

53. A method according to claim 51 wherein (a), (b) and (c) are repeated to sequentially process a batch of at least 2000 substrates.

54. A method according to claim 53 wherein (a), (b) and (c) are repeated to sequentially process a batch of at least 3000 substrates.

55. A method of processing a substrate, the method comprising:
   (a) placing the substrate in a process zone of a chamber;
   (b) providing in the process zone an energized process gas comprising etchant gas to etch the substrate, the etchant gas comprising a first halogen containing gas and one or more of $N_2$, a second halogen containing gas, $O_2$, and He—$O_2$; and
   (c) providing in the process zone a burst of energized cleaning gas while the substrate is being etched, the volumetric flow ratio of cleaning gas to etchant gases being sufficiently high to at least partially remove etchant residue deposited on surfaces in the chamber, the cleaning gas comprising fluorine species.

56. A method according to claim 55 wherein the energized cleaning gas comprises one or more of $NF_3$, $CF_4$, or $SF_6$.

57. A method of etching a substrate and cleaning an etching chamber, the method comprising:
   (a) placing the substrate in the etching chamber;
   (b) providing an energized process gas in the etching chamber in a volumetric flow rate selected to etch the substrate and at least partially remove etchant residue formed on the chamber surfaces, the process gas comprising carbon and fluorine species;
   (c) after (b), removing the etched substrate from the chamber; and
   (d) repeating (a), (b) and (c) to sequentially process a batch of at least 2000 substrates without performing a separate cleaning step to clean the chamber.

58. A method according to claim 57 wherein the process gas comprises $CF_4$.

59. A method according to claim 57 wherein the process gas comprises $Cl_2$, $N_2$, and $CF_4$, and wherein the ratio of the volumetric flow of $CF_4$: ($Cl_2+N_2$) is from about 1:20 to about 1:1.

60. A method according to claim 57 wherein (a), (b) and (c) are repeated to sequentially process a batch of at least 3000 substrates.

61. A method of etching a substrate and cleaning an etching chamber, the method comprising:
   (a) placing the substrate in the etching chamber; and
   (b) providing an energized process gas in the etching chamber in a volumetric flow rate selected to etch the substrate and at least partially remove etchant residue formed on the chamber surfaces, the process gas comprising sulfur and fluorine species;
   (c) after (b), removing the etched substrate from the chamber; and
   (d) repeating (a), (b) and (c) to sequentially process a batch of at least 2000 substrates without performing a separate cleaning step to clean the chamber.

62. A method according to claim 61 wherein the process gas comprises $SF_6$.

63. A method according to claim 61 wherein the process gas comprises $C_2$, $N_2$, and $SF_6$, and wherein the ratio of the volumetric flow of $SF_6$: ($Cl_2+N_2$) is from about 1:20 to about 1:1.

64. A method according to claim 61 wherein (a), (b) and (c) are repeated to sequentially process a batch of at least 3000 substrates.

65. A substrate processing method comprising:
   (a) placing a substrate in a chamber;
   (b) providing an energized etchant gas in the chamber to etch the substrate; and
   (c) providing a burst of energized cleaning gas in the chamber while the substrate is being etched to at least partially clean the chamber surfaces, the energized cleaning gas comprising carbon and fluorine species.

66. A method according to claim 65 wherein the cleaning gas comprises $CF_4$.

67. A method according to claim 65 wherein the etchant gas comprises one or more of $Cl_2$, $N_2$, $O_2$, HBr, or He—$O_2$.

68. A method according to claim 65 wherein the volumetric flow ratio of cleaning gas to etchant gas is from about 1:20 to about 1:1.

69. A substrate processing method comprising:
   (a) placing a substrate in a chamber;
   (b) providing an energized etchant gas in the chamber to etch the substrate; and
   (c) providing a burst of energized cleaning gas in the chamber while the substrate is being etched to at least partially clean the chamber surfaces, the energized cleaning gas comprising sulfur and fluorine species.

70. A method according to claim 69 wherein the cleaning gas comprises $SF_6$.

71. A method according to claim 69 wherein the etchant gas comprises one or more of $Cl_2$, $N_2$, $O_2$, HBr, or He—$O_2$.

72. A method according to claim 69 wherein the volumetric flow ratio of cleaning gas to etchant gas is from about 1:20 to about 1:1.

\* \* \* \* \*